US012760419B2

(12) United States Patent
Mankidy et al.

(10) Patent No.: US 12,760,419 B2
(45) Date of Patent: Oct. 13, 2026

(54) SHOWERHEAD FACEPLATES WITH ANGLED GAS DISTRIBUTION PASSAGES FOR SEMICONDUCTOR PROCESSING TOOLS

(71) Applicant: Lam Research Corporation, Fremont, CA (US)

(72) Inventors: Pratik Mankidy, Fremont, CA (US); John Holland, San Jose, CA (US); Anthony de la Llera, Fremont, CA (US); Rajesh Dorai, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 18/924,479

(22) Filed: Oct. 23, 2024

(65) Prior Publication Data

US 2025/0043425 A1 Feb. 6, 2025

Related U.S. Application Data

(63) Continuation of application No. 18/001,697, filed as application No. PCT/US2021/037247 on Jun. 14, 2021, now Pat. No. 12,139,791.
(Continued)

(51) Int. Cl.
*C23C 16/455* (2006.01)
*H01J 37/32* (2006.01)
(Continued)

(52) U.S. Cl.
CPC .. *C23C 16/45565* (2013.01); *H01J 37/32449* (2013.01); *C23C 2/003* (2013.01);
(Continued)

(58) Field of Classification Search
CPC .......... C23C 16/45565; C23C 16/4558; C23C 2/003; H01J 37/32449; H01J 37/3244; H10P 14/00; H10P 90/00
(Continued)

(56) References Cited

U.S. PATENT DOCUMENTS

| | | | |
|---|---|---|---|
| 5,643,394 | A | 7/1997 | Maydan et al. |
| 5,792,269 | A | 8/1998 | Deacon et al. |

(Continued)

FOREIGN PATENT DOCUMENTS

| | | | |
|---|---|---|---|
| CN | 1607889 | A | 4/2005 |
| CN | 101489344 | A | 7/2009 |

(Continued)

OTHER PUBLICATIONS

International Preliminary Report on Patentability dated Aug. 11, 2022 in PCT Application No. PCT/US2021/015430.

(Continued)

*Primary Examiner* — Minh Q Le
(74) *Attorney, Agent, or Firm* — Weaver Austin Villeneuve & Sampson LLP

(57) ABSTRACT

Showerhead faceplates for semiconductor processing chambers are provided that include one or more sets of gas distribution passages therethrough that extend at least partially along axes that are at an oblique angle to the showerhead faceplate center axis. Such angled gas distribution passages may be used to tailor the gas flow characteristics of such showerhead faceplates to produce various desired gas flow behaviors in the gas that is delivered to the wafer via such showerhead faceplates.

19 Claims, 14 Drawing Sheets

Related U.S. Application Data

(60) Provisional application No. 62/705,192, filed on Jun. 15, 2020.

(51) Int. Cl.
*C23C 2/00* (2006.01)
*H10P 14/00* (2026.01)
*H10P 90/00* (2026.01)

(52) U.S. Cl.
CPC ....... *C23C 16/4558* (2013.01); *H01J 37/3244* (2013.01); *H10P 14/00* (2026.01); *H10P 90/00* (2026.01)

(58) Field of Classification Search
USPC .......................................................... 137/861
See application file for complete search history.

(56) References Cited

U.S. PATENT DOCUMENTS

| | | | | |
|---|---|---|---|---|
| 6,821,347 | B2 | 11/2004 | Carpenter et al. | |
| 6,884,296 | B2 | 4/2005 | Basceri et al. | |
| 7,196,283 | B2 | 3/2007 | Buchberger, Jr. et al. | |
| 7,581,511 | B2 | 9/2009 | Mardian et al. | |
| 8,142,606 | B2 * | 3/2012 | Choi | C23C 16/45565 118/715 |
| 8,328,939 | B2 * | 12/2012 | Choi | C23C 16/455 156/345.43 |
| 8,926,790 | B2 | 1/2015 | Tetsuka et al. | |
| 9,082,593 | B2 | 7/2015 | Hayashi et al. | |
| 9,117,635 | B2 | 8/2015 | Satoh et al. | |
| 9,484,190 | B2 | 11/2016 | Glukhoy | |
| 9,758,869 | B2 | 9/2017 | Choi et al. | |
| 9,914,999 | B2 * | 3/2018 | Rasheed | C23C 16/4404 |
| 10,276,353 | B2 | 4/2019 | Alayavalli et al. | |
| 10,354,843 | B2 | 7/2019 | Liang et al. | |
| 10,378,107 | B2 | 8/2019 | Chandrasekharan et al. | |
| 10,622,189 | B2 | 4/2020 | Bravo et al. | |
| 12,136,539 | B1 * | 11/2024 | Lee | H01J 37/32642 |
| 2003/0089314 | A1 | 5/2003 | Matsuki et al. | |
| 2003/0166343 | A1 | 9/2003 | Furuse et al. | |
| 2005/0133161 | A1 | 6/2005 | Carpenter et al. | |
| 2006/0263522 | A1 * | 11/2006 | Byun | C23C 16/45519 427/248.1 |
| 2007/0144671 | A1 | 6/2007 | Ohmi et al. | |
| 2008/0078744 | A1 | 4/2008 | Wang et al. | |
| 2008/0206483 | A1 | 8/2008 | Paterson et al. | |
| 2009/0081878 | A1 | 3/2009 | Dhindsa | |
| 2009/0286405 | A1 | 11/2009 | Okesaku et al. | |
| 2010/0024727 | A1 | 2/2010 | Kim et al. | |
| 2010/0101603 | A1 | 4/2010 | Chebi et al. | |
| 2010/0178775 | A1 | 7/2010 | Okesaku et al. | |
| 2011/0127156 | A1 | 6/2011 | Foad et al. | |
| 2011/0162800 | A1 | 7/2011 | Noorbakhsh et al. | |
| 2014/0123900 | A1 | 5/2014 | Wang et al. | |
| 2014/0209023 | A1 | 7/2014 | Tsuda | |
| 2015/0011093 | A1 | 1/2015 | Singh et al. | |
| 2016/0273109 | A1 | 9/2016 | Harada et al. | |
| 2016/0340782 | A1 | 11/2016 | Chandrasekharan et al. | |
| 2017/0098556 | A1 | 4/2017 | Chandrasekharan et al. | |
| 2017/0365443 | A1 | 12/2017 | Carducci et al. | |
| 2017/0372914 | A1 | 12/2017 | Yamashita | |
| 2018/0096821 | A1 | 4/2018 | Lubomirsky | |
| 2019/0145002 | A1 | 5/2019 | Um et al. | |
| 2019/0244793 | A1 | 8/2019 | Chen et al. | |
| 2020/0321193 | A1 | 10/2020 | Ni et al. | |
| 2020/0381295 | A1 | 12/2020 | Cui et al. | |
| 2021/0054506 | A1 | 2/2021 | Chen et al. | |
| 2021/0079526 | A1 | 3/2021 | Iizuka | |
| 2021/0082665 | A1 | 3/2021 | Toland et al. | |
| 2021/0187521 | A1 | 6/2021 | Mustafa et al. | |
| 2022/0064797 | A1 | 3/2022 | Dhanakshirur et al. | |
| 2022/0178029 | A1 | 6/2022 | Obata et al. | |
| 2022/0285128 | A1 | 9/2022 | Ohashi | |
| 2023/0010178 | A1 | 1/2023 | Hirayama | |
| 2023/0057217 | A1 | 2/2023 | Povolny et al. | |
| 2023/0243034 | A1 | 8/2023 | Mankidy et al. | |

FOREIGN PATENT DOCUMENTS

| | | | |
|---|---|---|---|
| CN | 108103479 | A | 6/2018 |
| CN | 109075059 | A | 12/2018 |
| CN | 209471923 | U | 10/2019 |
| JP | 2005033167 | A | 2/2005 |
| JP | 2007019284 | A | 1/2007 |
| JP | 2007324529 | A | 12/2007 |
| JP | 3149701 | U | 4/2009 |
| JP | 2009239082 | A | 10/2009 |
| JP | 2010067615 | A | 3/2010 |
| JP | 2014070249 | A | 4/2014 |
| JP | 2017135316 | A | 8/2017 |
| JP | 2018082150 | A | 5/2018 |
| JP | 2019523995 | A | 8/2019 |
| JP | 2019161072 | A | 9/2019 |
| KR | 19990009332 | U | 3/1999 |
| KR | 20060100961 | A | 9/2006 |
| KR | 20100135967 | A | 12/2010 |
| KR | 20130141358 | A | 12/2013 |
| KR | 20160137404 | A | 11/2016 |
| KR | 20170006214 | A | 1/2017 |
| KR | 20170127358 | A | 11/2017 |
| KR | 20190002738 | A | 1/2019 |
| KR | 20190056112 | A | 5/2019 |
| TW | 202020216 | A | 6/2020 |
| WO | WO-2019222066 | A1 | 11/2019 |

OTHER PUBLICATIONS

International Preliminary Report on Patentability dated Dec. 29, 2022, in PCT Application No. PCT/US2021/037247.
International Search Report and Written Opinion dated May 21, 2021 in PCT Application No. PCT/US2021/015430.
International Search Report and Written Opinion dated Oct. 5, 2021, in PCT Application No. PCT/US2021/037247.
JP Office Action dated Oct. 29, 2024 in JP Application No. 2022-545970 with English translation.
TW Office Action dated Nov. 7, 2024 in TW Application No. 110103399, with English Translation.
U.S. Non-Final Office Action dated Mar. 14, 2024 in U.S. Appl. No. 18/001,697.
U.S. Notice of Allowance dated Jul. 10, 2024 in U.S. Appl. No. 18/001,697.
U.S. Appl. No. 17/759,509, Inventors Povolny et al., filed Jul. 25, 2022.
JP Notice of Allowance dated Mar. 24, 2026 in JP Application No. 2022-577088 with English translation.
JP Office Action dated Feb. 4, 2025 in JP Application No. 2022-577088, with English Translation.
JP Office Action dated Mar. 11, 2025 in JP Application No. 2022-545970, with English Translation.
JP Office Action dated Sep. 30, 2025 in JP Application No. 2022-577088, with English Translation.
KR Office Action dated Dec. 30, 2025 in KR Application No. 10-2023-7001650, with English Translation.
KR Office Action dated Jun. 30, 2025 in KR Application No. 10-2023-7001650, with English Translation.
KR Office Action dated Mar. 11, 2025 in KR Application No. 10-2022-7028703, with English Translation.
KR Office Action dated Nov. 5, 2025 in KR Application No. 10-2022-7028703, with English Translation.
SG Search Report and Written Opinion dated Sep. 16, 2025 in SG Application No. 11202261235T.
TW Office Action and Search Report dated Jul. 22, 2025 in TW Application No. 110121619, with English Translation.
TW Office Action dated Dec. 5, 2025 in TW Application No. 110121619, with English Translation.
U.S. Non-Final Office Action dated Oct. 10, 2025 in U.S. Appl. No. 17/759,509.

(56) References Cited

OTHER PUBLICATIONS

U.S. Notice of Allowance dated Feb. 18, 2026 in U.S. Appl. No. 17/759,509.

* cited by examiner

SHOWERHEAD FACEPLATES WITH ANGLED GAS DISTRIBUTION PASSAGES FOR SEMICONDUCTOR PROCESSING TOOLS

RELATED APPLICATION SECTION

An Application Data Sheet is filed concurrently with this specification as part of the present application. Each application that the present application claims benefit of or priority to as identified in the concurrently filed Application Data Sheet is hereby incorporated by reference herein in its entirety and for all purposes.

BACKGROUND

Semiconductor processing tools commonly use a "showerhead" to distribute semiconductor processing gases across a substrate or wafer that is supported within a semiconductor processing chamber by a pedestal or chuck. Showerheads typically feature a faceplate that faces towards the wafer and which includes a large number of gas distribution passages, e.g., holes, that deliver processing gas from one or more internal volumes of the showerhead through the faceplate during semiconductor processing operations. There are two general classes of showerheads used in semiconductor processing tools-"chandelier" type showerheads and "flush-mount" showerheads. Chandelier-type showerheads typically include a disk-like structure housing the gas distribution passages, one or more internal plenums for distributing processing gases to those gas distribution passages, and a stem that connects to or extends from a top side of the disk-like structure and up to or through a ceiling of the processing chamber in which the chandelier-type showerhead is located. The stem supports the disk-like structure within the processing chamber and also acts to route processing gases to the plenum(s) within the disk-like structure. A flush-mount showerhead does not have a stem or equivalent structure, and instead is simply mounted to the walls of the semiconductor processing chamber, often, in effect, acting as the lid to the semiconductor processing chamber.

A showerhead faceplate may, in various implementations, be a separate component from the remainder of the showerhead or may, for example, be an integral part of the showerhead, e.g., braised or welded together with other structures to form a single structure. Some showerheads may feature open internal plenums, e.g., one or more large volumes that are each fluidically connected with a process gas inlet and a plurality of the gas distribution passages, whereas other showerheads may incorporate a gas distribution plate, which may be structure internal to the showerhead that serves to route process gases from a process gas inlet of the showerhead to the various gas distribution passages of the showerhead faceplate.

Presented herein are various designs for showerhead faceplates that feature one or more sets of angled gas distribution passages.

SUMMARY

Details of one or more implementations of the subject matter described in this specification are set forth in the accompanying drawings and the description below. Other features, aspects, and advantages will become apparent from the description, the drawings, and the claims. The implementations described include, but are not limited to, at least the following specific implementations.

In some implementations, an apparatus may be provided that includes a showerhead faceplate having a plurality of gas distribution passages extending from a first side of the showerhead faceplate to a second side of the showerhead faceplate opposite the first side. In such implementations, the first side and the second side may define an average midplane of the showerhead faceplate. The second side of the showerhead faceplate, when the showerhead faceplate is installed in a semiconductor processing chamber as part of a showerhead of that semiconductor processing chamber, may face towards, and may be exposed to, a wafer support located within the semiconductor processing chamber. The showerhead faceplate may have an interior region and a perimeter region that surrounds the interior region when viewed along a center axis perpendicular to the average midplane, and a boundary between the interior region and the perimeter region, when viewed along the center axis, may be coincident with an interior circumferential wall surface of the showerhead when the showerhead faceplate is installed in the semiconductor processing chamber as part of the showerhead of that semiconductor processing chamber. The gas distribution passages in a first subset of gas distribution passages of the plurality of gas distribution passages may extend at least partially along axes that are at a first oblique angle to the center axis, and the gas distribution passages in the first subset of gas distribution passages may be located entirely within a first annular region within the interior region.

In some implementations, the gas distribution passages in the first subset of gas distribution passages may be arranged in an outermost circular pattern of a plurality of concentric circular patterns of the gas distribution passages, the gas distribution passages in the first set of gas distribution passages may each intersect the first side of the showerhead faceplate at locations closer to the center axis than locations at which the gas distribution passages in the first subset of gas distribution passages each intersect the second side of the showerhead faceplate, and one or more of the circular patterns may be located within the circular pattern having the first subset of gas distribution passages therewithin and are each a circular pattern of gas distribution passages that extend along directions parallel to the center axis.

In some implementations, the gas distribution passages in the first subset of gas distribution passages may be arranged in circular pattern of a plurality of concentric circular patterns of the gas distribution passages that is radially adjacent to an outermost one of the circular patterns, the gas distribution passages in the first set of gas distribution passages may each intersect the first side of the showerhead faceplate at locations closer to the center axis than locations at which the gas distribution passages in the first subset of gas distribution passages each intersect the second side of the showerhead faceplate, and one or more of the circular patterns may be located within the circular pattern having the first subset of gas distribution passages therewithin are circular patterns of gas distribution passages that extend along directions parallel to the center axis.

In some such implementations, the outermost circular pattern of gas distribution passages may be a circular pattern of a second subset of the gas distribution passages, and the gas distribution passages in the second subset of the gas distribution passages may extend along directions parallel to the center axis.

In some alternative such implementations, the outermost circular pattern of gas distribution passages may be a circular pattern of a second subset of the gas distribution passages, and the gas distribution passages in the second subset of the gas distribution passages may extend at least partially along axes that are at a second oblique angle to the center axis.

In some such implementations, the first and second oblique angles may be the same.

In some implementations, the gas distribution passages in the first subset of gas distribution passages may be arranged in an innermost circular pattern of the gas distribution passages of a plurality of concentric circular patterns of the gas distribution passages, the gas distribution passages in the first set of gas distribution passages may each intersect the second side of the showerhead faceplate at locations closer to the center axis than locations at which the gas distribution passages in the first subset of gas distribution passages each intersect the first side of the showerhead faceplate, and one or more of the circular patterns may be located outside of the circular pattern having the first subset of gas distribution passages therewithin and are each a circular pattern of gas distribution passages that extend along directions parallel to the center axis.

In some such implementations of the apparatus, the innermost circular pattern of gas distribution passages may be a circular pattern of multiple clusters of gas distribution passages, each cluster of gas distribution passages having one or more of the gas distribution passages in the first subset of gas distribution passages.

In some implementations of the apparatus, the gas distribution passages in the first subset of gas distribution passages may be the closest gas distribution passages to the center axis.

In some implementations of the apparatus, an additional subset of gas distribution passages of the plurality of gas distribution passages may extend at least partially along axes that are at a second oblique angle to the center axis, the first oblique angle may be different from the second oblique angle, and the gas distribution passages of the additional subset of gas distribution passages may also be located within the first annular region.

In some implementations of the apparatus, an additional subset of gas distribution passages of the plurality of gas distribution passages may extend at least partially along axes that are parallel to the center axis, and the gas distribution passages of the additional subset of gas distribution passages may also be located within the first annular region.

In some implementations of the apparatus, the gas distribution passages in the first subset of gas distribution passages may be arranged in multiple concentric circular patterns.

In some of the previously discussed implementations, the angles between the center axis and the axes along which the gas distribution passages in each circular pattern at least partially extend may be the same for each circular pattern.

In some other versions of the previously discussed implementations, the angles between the center axis and the axes along which the gas distribution passages in each circular pattern at least partially extend may increase as a function of increasing diameter of each circular pattern.

In yet some other versions of the previously discussed implementations, the angles between the center axis and the axes along which the gas distribution passages in each circular pattern at least partially extend may decrease as a function of increasing diameter of each circular pattern.

In some versions of the previously discussed implementations, each gas distribution passage in the first subset of gas distribution passages may follow a linear path through the showerhead faceplate. In some other versions of the previously discussed implementations, each gas distribution passage in the first subset of gas distribution passages may follow a non-linear path through the showerhead faceplate.

In some versions of the previously discussed implementations, each gas distribution passage in the first subset of gas distribution passages may follow a branching path through the showerhead faceplate and may have an inlet opening on the first side of the showerhead faceplate and two or more outlet openings on the second side of the showerhead faceplate.

In some such implementations, each branching path for the gas distribution passages in the first subset of gas distribution passages may have multiple portions including an inlet portion and multiple outlet portions, the inlet portion of each gas distribution passage in the first subset of gas distribution passages may have a first end that terminates at the inlet opening for that gas distribution passage, each outlet portion of each gas distribution passage in the first subset of gas distribution passages may have a first end that terminates at one of the outlet openings for that gas distribution passage, the inlet portion and the outlet portions of each gas distribution passage in the first subset of gas distribution passages may have second ends that are fluidically connected with each other within the showerhead faceplate, and at least two of the outlet portions for each gas distribution passage in the first subset of gas distribution passages may be of equal lengths.

In some other such implementations of the apparatus, each branching path for the gas distribution passages in the first subset of gas distribution passages may have multiple portions including an inlet portion and multiple outlet portions, the inlet portion of each gas distribution passage in the first subset of gas distribution passages may have a first end that terminates at the inlet opening for that gas distribution passage, each outlet portion of each gas distribution passage in the first subset of gas distribution passages may have a first end that terminates at one of the outlet openings for that gas distribution passage, the inlet portion and the outlet portions of each gas distribution passage in the first subset of gas distribution passages may have second ends that are fluidically connected with each other within the showerhead faceplate, and at least two of the outlet portions for each gas distribution passage in the first subset of gas distribution passages may be of different lengths.

In some implementations of the apparatus, at least two of the outlet portions for each gas distribution passage in the first subset of gas distribution passages may have different cross-sectional areas in corresponding cross-sectional planes and each cross-sectional plane may be perpendicular to a portion of the branching path followed by the corresponding outlet portion.

In some implementations of the apparatus, the inlet portion of each gas distribution passage in the first subset of gas distribution passages may have a different cross-sectional area in a corresponding cross-sectional plane than a cross-sectional area of one or more of the outlet portions for that gas distribution passage in a corresponding cross-sectional plane, and each cross-sectional plane may be perpendicular to a portion of the branching path followed by the corresponding portion.

In some of the above-discussed implementations, the gas distribution passages in a second subset of gas distribution passages of the plurality of gas distribution passages may be located within a second annular region within the interior region, and the first annular region may be different from the second annular region.

In some such implementations, the gas distribution passages in the second subset of gas distribution passages may extend along axes that that are parallel to the center axis.

In some implementations, the second annular region may have an inner boundary and an outer boundary, the first annular region and the second annular region may be concentric, and the first annular region may be positioned within the inner boundary.

In some implementations, the first annular region may have an inner boundary and an outer boundary, the first annular region and the second annular region may be concentric, and the second annular region may be positioned within the inner boundary.

In some implementations, there may be multiple concentric rings of gas distribution passages within the second subset of gas distribution passages.

In some implementations discussed above, the apparatus may further include the semiconductor processing chamber, the showerhead, and the wafer support. In such implementations, the showerhead may be positioned above the wafer support within the semiconductor processing chamber, the wafer support may have a circular wafer support region of diameter D that is configured to support a semiconductor wafer with a nominal diameter of D, the showerhead faceplate may be installed in the showerhead such that the second side of the showerhead faceplate faces towards the wafer support, and there may be no structure between the showerhead faceplate and at least 90% of the wafer support region.

In some such implementations, the apparatus may include a gas distribution plate that is located within the showerhead and that has outlet ports that are configured to provide processing gas to the gas distribution passages.

BRIEF DESCRIPTION OF THE FIGURES

Reference to the following Figures is made in the discussion below; the Figures are not intended to be limiting in scope and are simply provided to facilitate the discussion below.

DETAILED DESCRIPTION

Examples of various embodiments are illustrated in the accompanying drawings and described further below. It will be understood that the discussion herein is not intended to limit the claims to the specific embodiments described. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well-known process operations have not been described in detail in order not to unnecessarily obscure the present invention.

Figure 1:
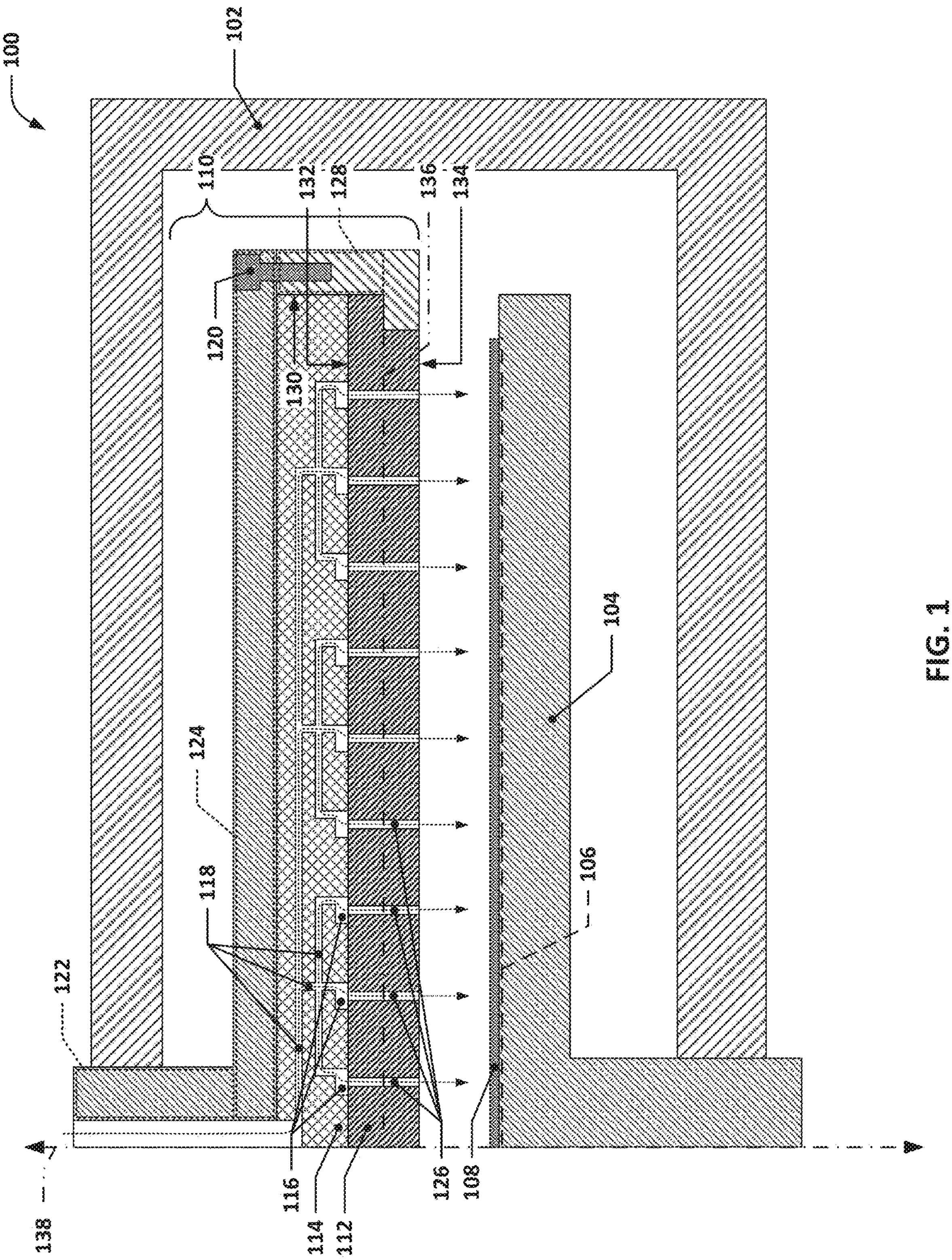
FIG. 1 depicts a simplified diagram of an example semiconductor processing apparatus.

FIG. 1 depicts a simplified diagram of an example semiconductor processing apparatus. FIG. 1 depicts an apparatus 100 that includes a semiconductor processing chamber 102 having a wafer support 104 and a showerhead 110 located within it. It will be appreciated that FIG. 1 shows only half of the various structures depicted in it; the other half may be generally similar in appearance, although not necessarily so. To illustrate this general symmetry, a center axis 138 is shown in FIG. 1, with the portions of the apparatus to the left of the center axis 138 omitted. The wafer support 104 has a wafer support region 106 that may be used to support a wafer 108 within the semiconductor processing chamber 102 during wafer processing operations. As seen in FIG. 1, the wafer support 104 is located beneath the showerhead 110 such that processing gases that flow through the showerhead 110, as represented by the dotted arrows, flow out onto, and across, the wafer 108.

The showerhead 110, in this example, is a chandelier-type showerhead with a stem 122 that is connected to a backplate 124. The backplate 124, in this case, has a plurality of holes through it into which threaded fasteners 120 are inserted. The threaded fasteners 120 may be used to retain a ring-like circumferential wall 128 to the backplate 124. The circumferential wall 128 may, in turn, have a circumferential ledge or other retention structure around its internal perimeter that may engage with, and support, a showerhead faceplate 112. The circumferential wall 128 may also have an interior circumferential wall surface 130 that defines, at least in part, an interior volume of the showerhead 110. It will be appreciated that other showerhead designs considered within the scope of this disclosure may utilize other circumferential wall structures, including, for example, circumferential walls that are simply an extension of, and contiguous with, the backplate 124 and/or the showerhead faceplate 112.

The showerhead faceplate 112 may have a plurality of gas distribution passages 126 passing therethrough. While the showerhead faceplate shown has a relatively coarse spacing between the gas distribution passages 126 passing therethrough, it will be understood that there may be hundreds or thousands of such gas distribution passages 126 extending from a first side 132 of the showerhead faceplate 112 through the showerhead faceplate 112 to a second side 134 of the showerhead faceplate 112 that faces towards, and is exposed to, the wafer support 104 when the showerhead faceplate 112 is installed in the showerhead 110. The first side 132 and the second side 134 may define an average midplane 136 between them. It will be understood that one or both of the first side 132 and the second side 134, while shown in FIG. 1 as being planar in nature, may, in some implementations, be contoured or otherwise have non-planar profiles.

The average midplane 136, as the term is used herein, may refer to a reference plane that is located and oriented with respect to one or more surfaces such that the average and maximum distances between the average midplane and those one or more surfaces are minimized. The average midplane of a component or portion of a component is to be understood to be the average midplane defined by the major surfaces of such a component or portion of a component, e.g., the larger surfaces of such a component or portion thereof, but excluding, for example, small holes or other minute features that do not significantly contribute to the overall shape of the component or portion thereof. For example, for a colander, the average midplane thereof would be defined by the inner and outer surfaces of the bowl part of the colander, but would not be defined by the interior surfaces of the hundreds or thousands of holes through the colander, or by the surfaces of the handles of the colander (if present).

It will be understood that a showerhead faceplate, as the term is used herein, refers to a structure that is part of a semiconductor processing showerhead and which has a surface with openings to gas distribution passages that faces towards a wafer support when installed within a showerhead in a semiconductor processing chamber. Showerhead faceplates are typically the closest component or element of a showerhead to a wafer that is processed in such semiconductor processing chambers, and there is generally no other structure of the semiconductor processing chamber or tool between the showerhead faceplate and at least 90% of the wafer support region of the wafer support positioned beneath it (at least during normal wafer processing operations-wafer handling robots, of course, may insert end effectors into this space during wafer loading/unloading operations, but these transitory instances do not occur during wafer processing operations). The wafer that may be supported by the wafer support region, of course, is not actually a component or structure of the semiconductor processing chamber or tool. In practice, there may be no structure or almost no structure of the semiconductor processing chamber or tool between the wafer support region and the showerhead faceplate, although in some cases, an edge ring may be used. Edge rings encircle the wafer and may overlap a thin annular perimeter region of the wafer (and thus the wafer support region). Generally speaking, while this may result in some structure (the inner edge of the edge ring) being interposed between the showerhead faceplate and the wafer support region, the amount of such overlap falls well below 10% of the area of the wafer support region.

In the apparatus 100 of FIG. 1, the showerhead 110 also includes a gas distribution plate 114 that includes a number of gas distribution plate passages 118 that distribute processing gas to a plurality of gas distribution ports 116 in the gas distribution plate 114 that are adjacent to the first side 132 of the showerhead faceplate 112. The gas distribution plate 114 may be engineered to provide a predetermined distribution of gas flow to the various gas distribution passages 126 that has been tailored to various desired processing conditions.

Figure 2:
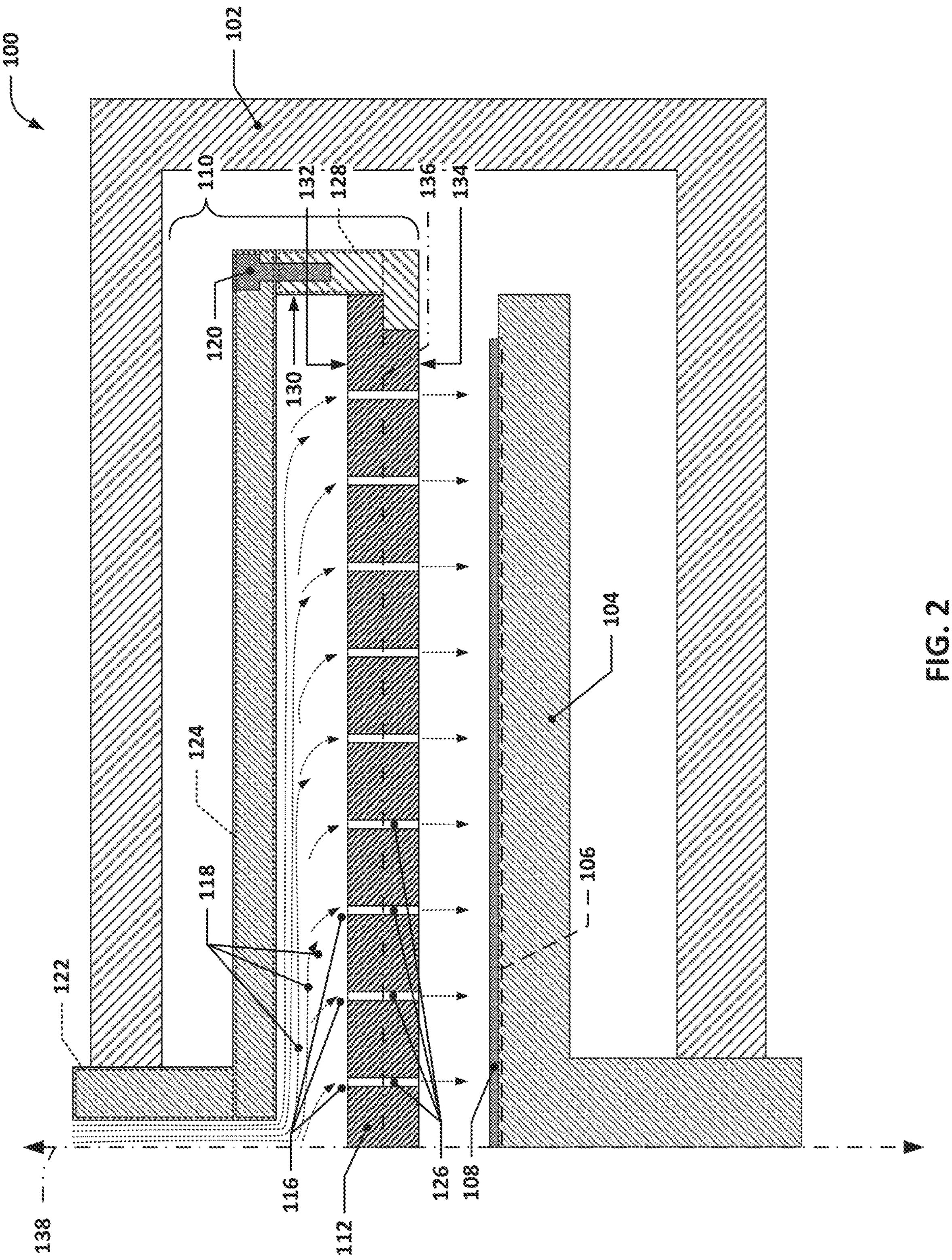
FIG. 2 depicts a simplified diagram of another example semiconductor processing apparatus.

FIG. 2 depicts a simplified diagram of another example semiconductor processing apparatus. The apparatus 100 of FIG. 2 is the same as the apparatus 100 of FIG. 1, except that the apparatus 100 of FIG. 2 does not include the gas distribution plate 114 and thus simply has an open interior plenum volume that acts to provide processing gases delivered through a gas inlet in the stem 122 to the gas distribution passages 126.

Various types of angled gas distribution passages or combinations of angled and non-angled (i.e., parallel to the center axis) gas distribution passages discussed below may be used in the context of either type of showerhead depicted in FIGS. 1 and 2, as well as in flush-mount showerheads of similar internal design. Such showerheads may, in some implementations, also serve as electrodes, e.g., in a charge-coupled plasma processing chamber.

Figure 3:
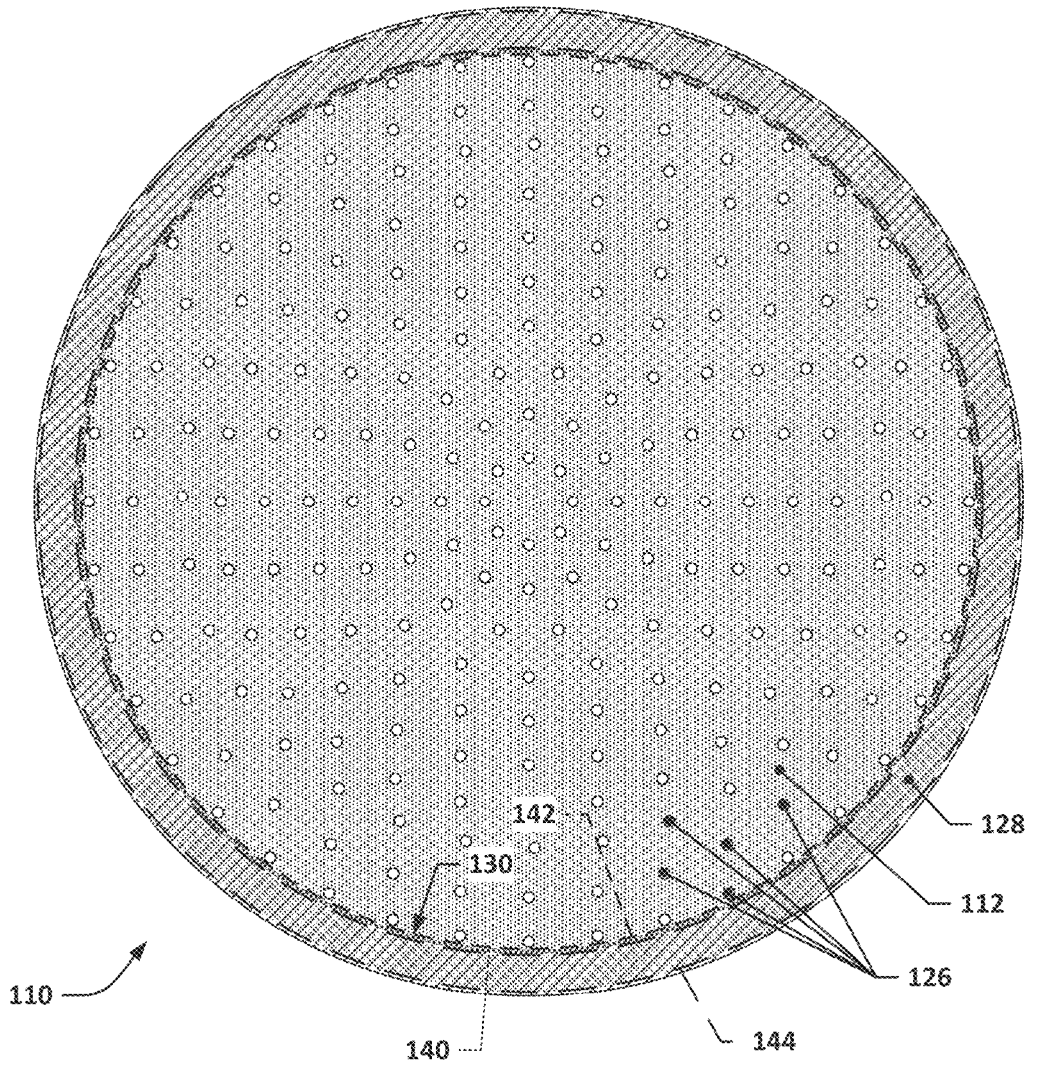
FIG. 3 depicts a plan view cross-sectional view of an example showerhead.

FIG. 3 depicts a plan view cross-sectional view of an example showerhead, i.e., a view along the center axis 138. As can be seen, the showerhead 110 has an interior region 142 that is encircled by a perimeter region 144. A boundary 140 between the interior region 142 and the perimeter region 144 may be coincident with the interior circumferential wall surface 130 of the circumferential wall 128.

In some embodiments, the showerhead faceplates 112 that are shown in FIGS. 1 and 2 are showerhead faceplates in which the gas distribution passages 126 within the interior region 142 of the showerhead faceplate 112 are all holes with center axes that are parallel to the center axis 138. In some embodiments, however, that showerhead faceplates 112 that feature at least some gas distribution passages 126 that extend at least partially along axes that are at an oblique angle to the center axis 138 may offer the ability to fine-tune or otherwise modify the gas flow out of such showerhead faceplates 112 to adapt such gas flow to various process needs. For example, showerhead faceplates with obliquely angled gas distribution passages may allow gas distribution plates, e.g., such as gas distribution plate 114 of FIG. 1, that are developed for a particular process to be repurposed for use in other processes that would benefit from having gas delivered from at least some points on the underside of the showerhead faceplate that do not align with the locations of the gas distribution ports, e.g., gas distribution ports 116, of the gas distribution plate. By using angled gas distribution passages, it is possible to adapt a particular gas distribution plate design for use with multiple different faceplates. In some embodiments, the showerhead 110 may have gas distribution passages that terminate at different locations on the wafer-facing side of the showerhead faceplate 112 but that terminate at the same or nearly the same locations on the gas distribution plate-facing side of the showerhead faceplate 112. This allows for the gas distribution profile of each such showerhead to be modified or tuned by positioning the gas distribution passage exit holes without necessarily requiring that the gas distribution plate 114 used therewith be modified to have matching gas distribution ports in the same locations. This avoids the potential costs involved with developing, testing, and qualifying a new gas distribution plate or new showerhead faceplates for each such showerhead.

One or more subsets of the gas distribution passages 126 of a given showerhead faceplate 112 may include such angled or partially angled gas distribution passages 126. Each such subset may be included in a corresponding annular region of the showerhead faceplate 112; in some cases, two or more subsets may be included in a common annular region of the showerhead faceplate 112. In other cases, a subset may include gas distribution passages 126 that are arranged within two or more annular regions that in which other gas distribution passages 126 are located.

Figure 4:
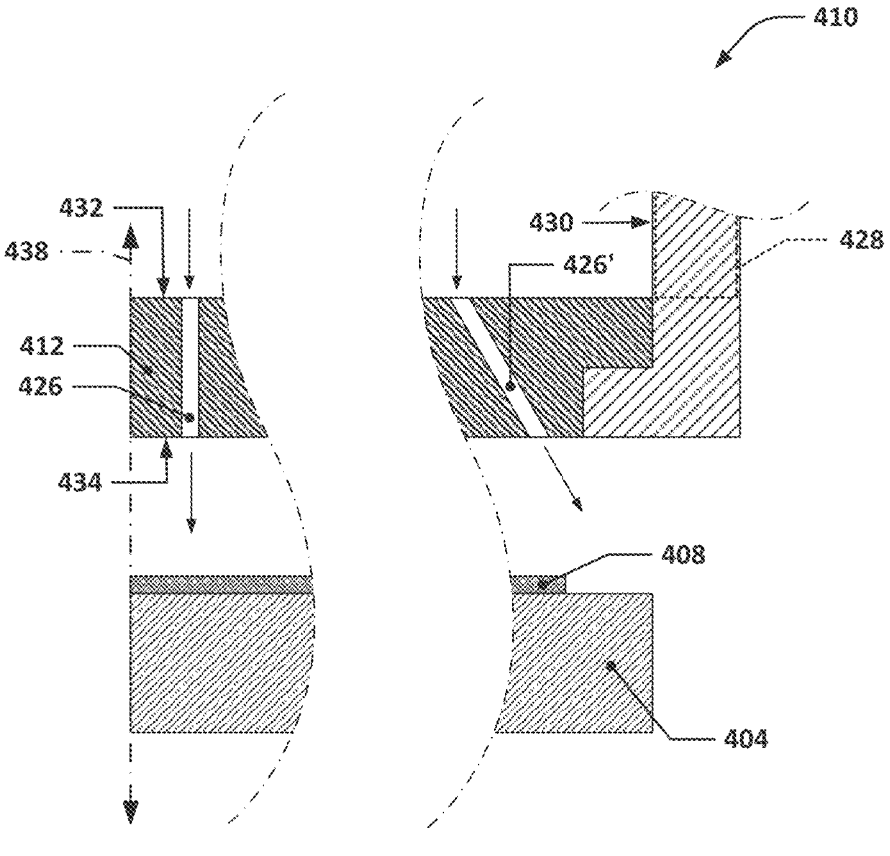
FIG. 4 depicts a cross-sectional view of portions of an example showerhead faceplate installed in an example semiconductor processing apparatus.

FIG. 4 depicts a cross-sectional view of portions of an example showerhead faceplate installed in an example semiconductor processing apparatus. In FIG. 4, a showerhead 410 is shown over a wafer support 404 and a wafer 408. The showerhead 410 is shown only partially, with the portion to the left of a center axis 438 being omitted, and the portion of the showerhead faceplate 412 between the curved breakout lines also being omitted. It will be generally understood that the portion of the showerhead faceplate 412 between the breakout lines may also have gas distribution passages 426 through it.

As can be seen in FIG. 4, the showerhead faceplate 412 has a first side 432 and a second side 434; gas distribution passages 426 and 426' may extend through the showerhead faceplate 412 from the first side 432 to the second side 434. A circumferential wall surface 430 of a circumferential wall 428 may act to define an interior region of the showerhead faceplate 412 within which the gas distribution passages 426 and 426' may be located.

As can be seen in FIG. 4, the gas distribution passages 426 closest to the center axis 438 of the showerhead faceplate 412 are holes with center axes that are parallel to the center axis 438, i.e., non-angled. However, the gas distribution passages 426' that are furthest from the center axis 438 are holes that extend along axes that are at an oblique angle to the center axis 438. In this example, the gas distribution passages 426' that are furthest from the center axis 438 are angled such that the locations where such gas distribution passages 426' intersect the first side 432 of the showerhead faceplate 412 are closer to the center axis 438 than the locations where those gas distribution passages 426' intersect the second side 434 of the showerhead faceplate 412.

In some implementations similar to that of FIG. 4, the showerhead faceplate may have, for example, a first circular array of gas distribution passages in which the gas distribution passages extend along axes that are at oblique angles to the center axis. The gas distribution passages in the first circular pattern may extend at least partially along an axis that is at an angle of between about 40° and 65° with respect to an axis that is parallel to the center axis, e.g., between about 50° and 55°. In some implementations, these gas distribution passages may be angled such that the locations where those gas distribution passages intersect the first side of the showerhead faceplate are closer to the center axis of the showerhead faceplate than the locations where those gas distribution passages intersect the second side of the showerhead faceplate. It will be understood that references to circular patterns herein refer to nominally circular patterns, which include both perfect circular patterns (in which items in the circular pattern are located at positions that coincide with locations that are located with perfectly equidistant spacing about the circumference of a circle) and generally circular patterns (which may have items in the pattern that deviate slightly from such perfect circular patterning, e.g., having a subset of the items positioned at locations less than between 1% to 2% of the circular pattern diameter away from the "perfect" circular pattern position).

Figure 5:
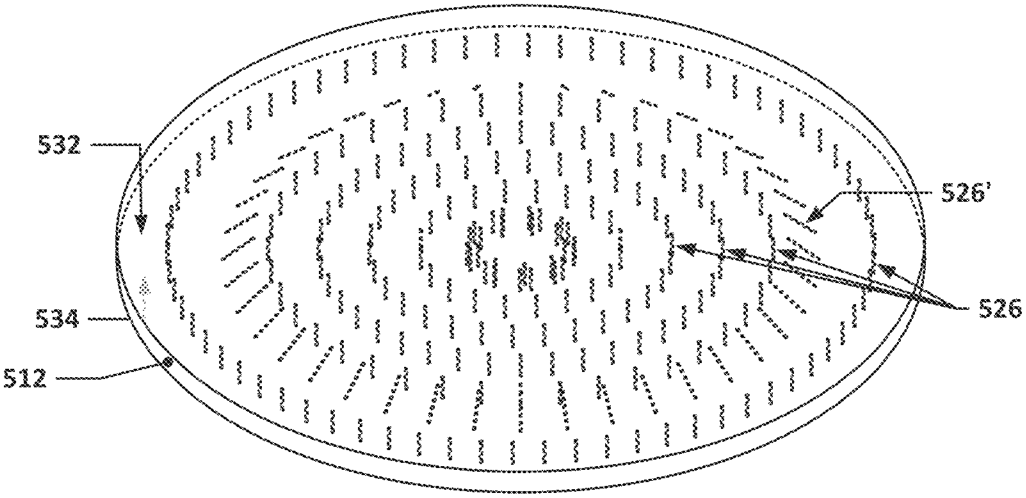
FIGS. 5, 6, and 7 depict an isometric view, top view, and side partial-section view of an example showerhead faceplate.
Figure 6:
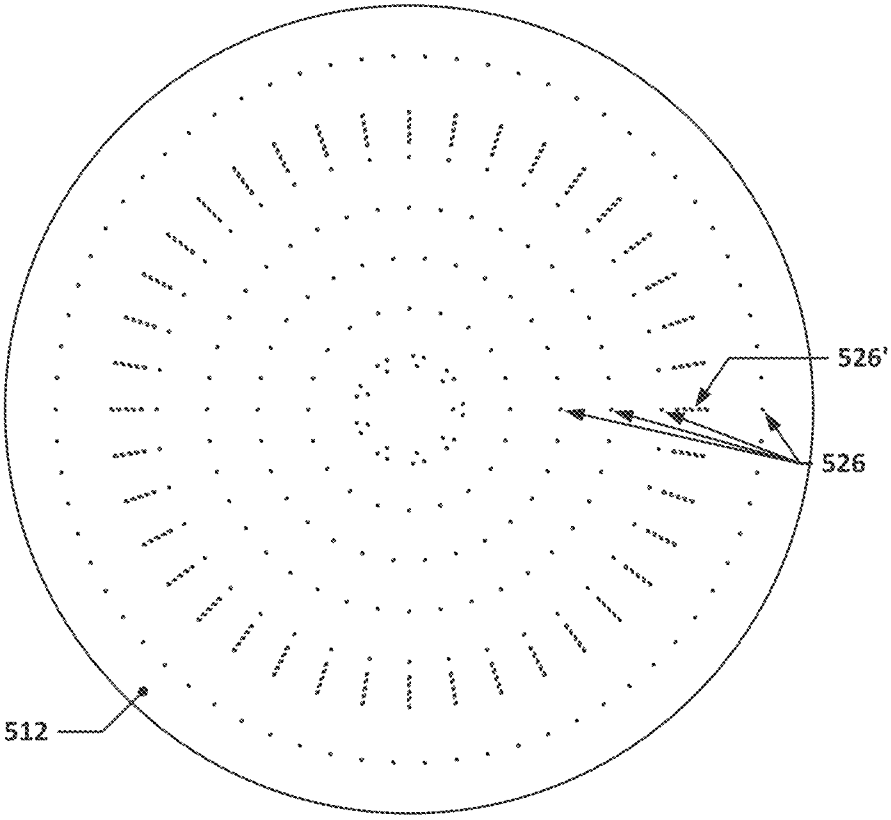
Figure 7:
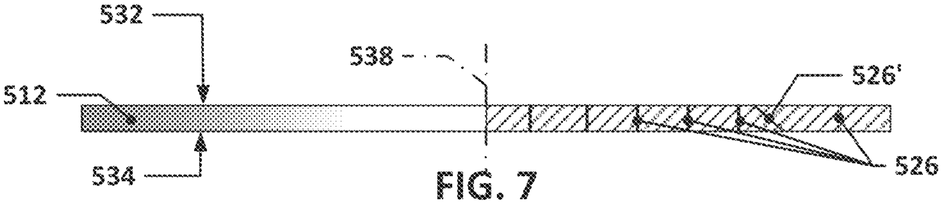

FIGS. 5, 6, and 7 depict an isometric view, top view, and side partial-section view of an example showerhead faceplate such as the above; the discussion below may reference aspects of this example, but it will be understood that the depicted example is not limiting to the below discussion. In FIGS. 5, 6, and 7, a showerhead faceplate 512 is shown that has a first side 532 and a second side 534 (which would normally face towards a wafer being processed when the showerhead faceplate 512 is in active use). The showerhead faceplate 512 includes a number of gas distribution passages 526, including obliquely angled gas distributed passages 526', that extend between the first side 532 and the second side 524 and that are arranged in circular patterns about a center axis 538 of the showerhead faceplate 512.

In some implementations, there may also be multiple additional concentric circular patterns of gas distribution passages that are arranged around the center axis 538 of the showerhead faceplate as well. For example, there may be 5, 6, 7, 8, 9, 10, etc. additional concentric circular patterns of gas distribution passages that extend through the showerhead faceplate. In some instances, some of the circular patterns of gas distribution passages may be circular patterns of much smaller circular patterns of gas distribution passages, e.g., small (such as 0.1 in to 0.5 in diameter) circular patterns of gas distribution passages may themselves be arranged in one or more of the concentric circular patterns. For example, showerhead faceplate 512 includes a total of 7 concentric circular patterns of gas distribution passages (including the first circular pattern, which includes the obliquely angled gas distribution passages 526'). The innermost circular pattern of gas distribution passages shown in FIGS. 5 and 6 is actually a circular pattern of small clusters of gas distribution passages 526 that are, within each such cluster, also arranged in a smaller circular pattern.

It will be understood that, generally speaking, small clusters of gas distribution passages, e.g., as discussed above, may be used in any arrangements of gas distribution passages discussed herein in place of single gas distribution passages, e.g., any circular pattern of gas distribution passages may also be implemented as a circular pattern of clusters of gas distribution passages. Moreover, any such cluster may be composed of all obliquely angled gas distribution passages, all non-obliquely angled passages (i.e., extending along axes parallel to the center axis), or a mixture thereof.

In FIGS. 5 through 7, the first circular pattern of gas distribution passages 526' is in between the outermost circular pattern of gas distribution passages 526 (which are not obliquely angled) and the second circular pattern of gas distribution passages 526 radially inward from the outermost circular pattern of gas distribution passages 526.

In some such implementations, there may be seven additional concentric patterns of gas distribution passages, with the innermost concentric pattern, in some instances, including subsets of gas distribution passages that are each arranged in a much smaller circular pattern (with the center of each smaller circular pattern being centered on the larger concentric circular pattern's pattern locations). The gas distribution passages in some or all of such additional concentric circular patterns of gas distribution passages may extend along axes that are parallel to the center axis of the showerhead faceplate. In some further such implementations, each circular pattern of gas distribution passages may have between 6 and 14 or, in some cases, between 8 and 12 additional gas distribution passages in it as compared with the number of gas distribution passages (or sets of gas distribution passages with regard to the innermost circular pattern) in the next smallest diameter circular pattern of gas distribution passages. Such additional concentric circular patterns may have diameters that are larger than the diameter of the circular pattern of the multiple sets of gas distribution passages, e.g., each circular pattern (with respect to the locations where the gas distribution passages intersect the first side of the showerhead faceplate) may generally have a radius on the order of 0.5 in to 1 in larger than the radius of the next closest smaller circular pattern. The gas distribution passages in such implementations may, for example, be approximately 0.02 inches to 0.04 inches in diameter.

In some such implementations, the radial spacing between the circular pattern of the obliquely angled gas distribution passages and the neighboring circular pattern or patterns of gas distribution passages may be greater than or less than as discussed above. For example, in some implementations the first circular pattern of the obliquely angled gas distribution passages may be radially interposed between two other circular patterns of gas distribution passages, with the gas distribution passages in the first circular pattern intersecting the first side of the showerhead faceplate at locations in a circular pattern having a radius that is within 0.1 in to 0.2 in of the radius of the closest circular pattern within the first circular pattern. In some further such implementations, the other circular pattern of gas distribution passages that is radially outward from, and radially adjacent to, the first circular pattern may be spaced radially outward from the first circular pattern such that the locations where the gas distribution passages intersect the first and second sides of the showerhead faceplate all lie completely in between the two circular patterns that are radially adjacent to the first circular pattern. "Radially adjacent," as the term is used herein in the context of concentric circular patterns or concentric circles, is used to refer to two of a particular type of item or feature (such as a circular pattern) that are concentrically arranged and that do not have other instances of that item or feature in between them. Thus, in a set of five concentric rings, the third ring would be radially adjacent to the second and fourth rings, but not the first and fifth rings.

In some implementations, a showerhead faceplate as shown in FIGS. 5 through 7 may provide for increased residence time for processing gas along the outer perimeter of the wafer being processed. For example, the showerhead faceplate of FIGS. 5 through 7 may be used with a gas distribution plate (not shown, but see, for example, FIG. 1) that uses a zoned approach, e.g., having first gas distribution ports within a circular region that deliver gas under first flow conditions and having second gas distribution ports outside of the circular region that deliver gas under second flow conditions. Such a gas distribution plate may, for example, have two rings of second gas distribution ports and a plurality of rings of first gas distribution ports. The two rings of second gas distribution ports may normally be used to provide gas under the second flow conditions to two corresponding outer rings of gas distribution passages in a showerhead faceplate. Similarly, the rings of the first gas distribution ports may normally be used to supply gas under first flow conditions to corresponding inner rings of gas distribution passages in such a showerhead faceplate.

Referring to the showerhead faceplate of FIGS. 5 through 7, in some embodiments, the angled gas distribution passages 526' in the first circular pattern may be used to deliver gas from an outermost ring of the first gas distribution ports of the zoned gas distribution plate disclosed above, such that the gas is directed out of the underside of the showerhead faceplate at a location that is outside of the circular region. For example, in FIGS. 5 through 7, the circular region would inscribe the holes where the angled gas distribution passages 526' intersect the first side 532. Thus, the outermost ring of the first gas distribution ports would provide gas under the first flow conditions to two concentric rings of gas distribution passages—the gas distribution passages 526' and the ring of gas distribution passages 526 immediately radially inward therefrom, of the showerhead faceplate 512. At the same time, the two rings of second gas distribution ports would provide gas under the second flow conditions to only a single outer ring of gas distribution passages 526 of the showerhead faceplate 512, i.e., the outermost ring of gas distribution passages 526. Such an arrangement may cause more gas to be directed to locations nearer the wafer edge and for such gas to stay resident over the wafer edge (which may be positioned approximately beneath the outermost ring of gas distribution passages 526, for example) for longer periods of time, than may be achieved with a showerhead faceplate having only vertical, non-angled gas distribution passages corresponding to the locations of the gas distribution ports on the gas distribution plate. As a result, the showerhead faceplate of FIGS. 5 through 7 may provide for increased wafer edge uniformity as compared with a non-angled gas distribution showerhead faceplate used with the same gas distribution plate.

Figure 8:
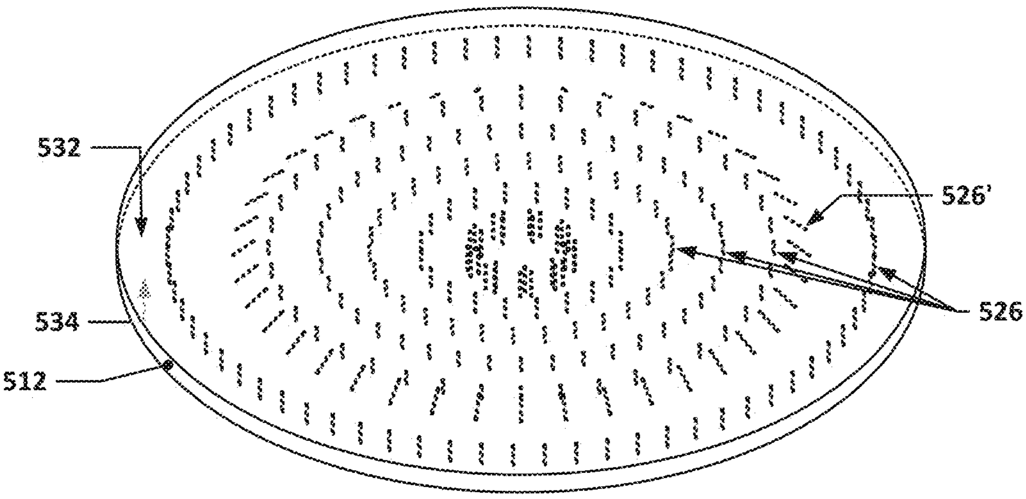
FIGS. 8, 9, and 10 depict an isometric view, top view, and side partial-section view of an example showerhead faceplate similar to that of FIGS. 5, 6, and 7 but having a contoured underside.
Figure 9:
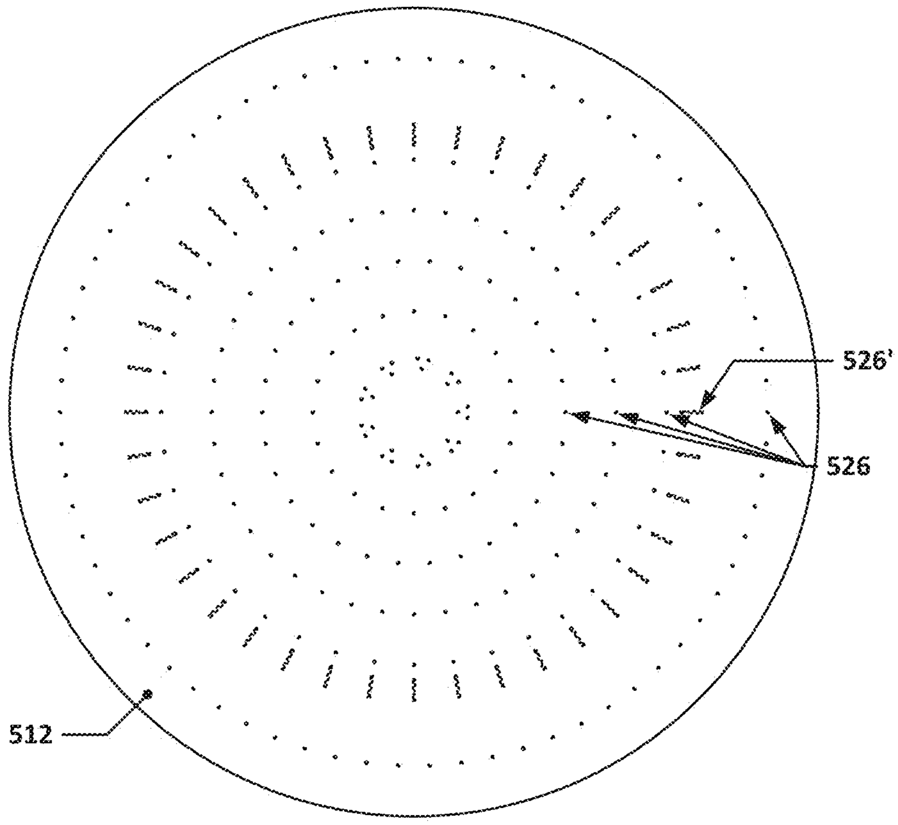
Figure 10:
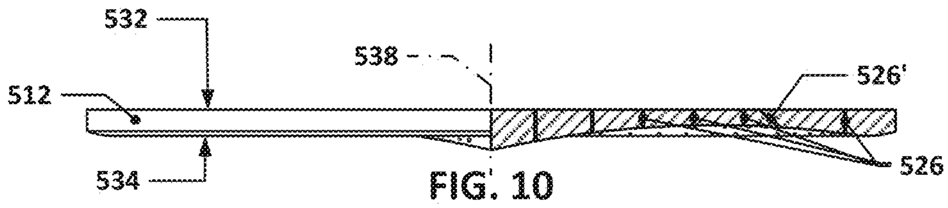

FIGS. 8, 9, and 10 depict an isometric view, top view, and side partial-section view of an example showerhead faceplate similar to that of FIGS. 5, 6, and 7 but having a contoured underside. The contoured underside of the showerhead faceplate may be configured to modify the plasma distribution of a plasma that may be struck beneath the showerhead faceplate. For example, the showerhead faceplate may serve as an electrode in a plasma generation context, and the contour of the showerhead faceplate may promote enhanced plasma stability and decreased non-uniformity in the wafer processing that is performed using the showerhead faceplate.

For example, as shown in FIGS. 8, 9, and 10, the lower surface of the showerhead faceplate 512 may be curved (e.g., convex) in a center region and concave in an outer region. In other words, the lower surface transitions from a circular convex center region to an annular concave outer region, and both the center region and the concave region may vary in thickness. For example, the lower surface may be contoured so that the thickness or distance between the upper and lower surfaces of the showerhead faceplate may decrease in a curvilinear fashion from the center of the showerhead faceplate 512 and into the outer region thereof. The lower surface may be further contoured so that the thickness or distance between the upper and lower surfaces of the showerhead faceplate may then increase in a curvilinear fashion once in the outer region of the showerhead faceplate 512 before again starting to decrease or remain flat near the outer perimeter thereof.

In some additional such implementations, there may be multiple concentric circular patterns of gas distribution passages that extend along axes that are at an oblique angle with respect to the center axis of the showerhead faceplate.

For example, in some implementations, the first circular pattern may be the next-to-outermost circular pattern of gas distribution passages in the showerhead faceplate, and the showerhead faceplate may include a second circular pattern that is radially adjacent to the first circular pattern and that is the outermost circular pattern of gas distribution passages. Both the first circular pattern and the second circular pattern may include gas distribution passages that extend at least partially along axes that are at an oblique angle to axes that are parallel to the center axis of the showerhead faceplate, e.g., such that the locations where each such gas distribution passage intersects the first side are located closer to the center axis of the showerhead faceplate than the locations where those same gas distribution passages intersect the second side of the showerhead faceplate.

Figure 11:
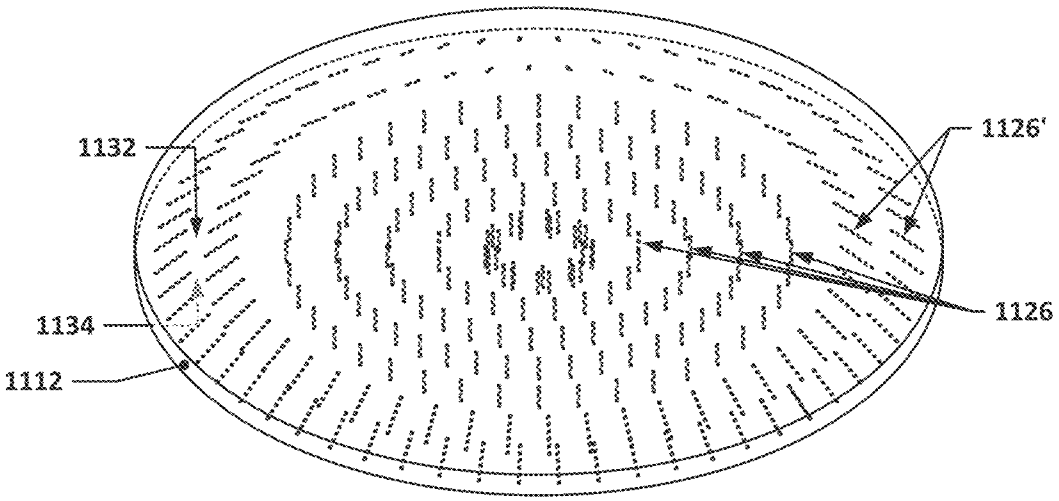
FIGS. 11, 12, and 13 depict an isometric view, top view, and side partial-section view of another example showerhead faceplate.
Figure 12:
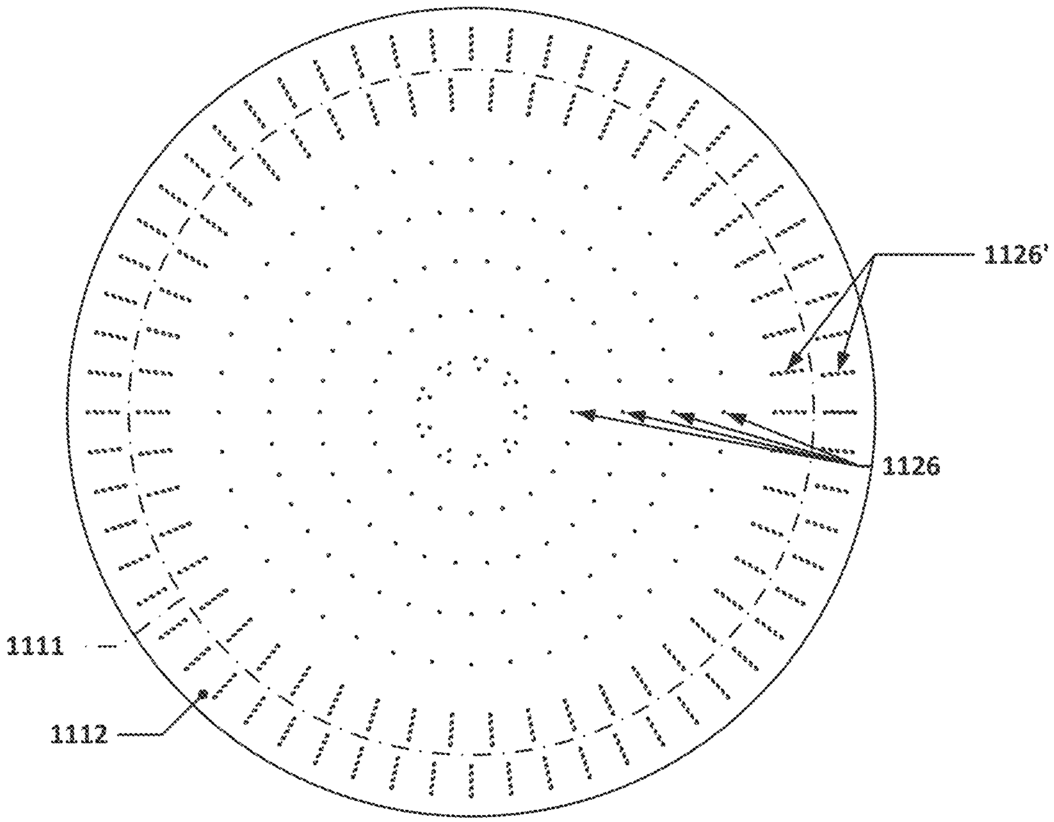
Figure 13:
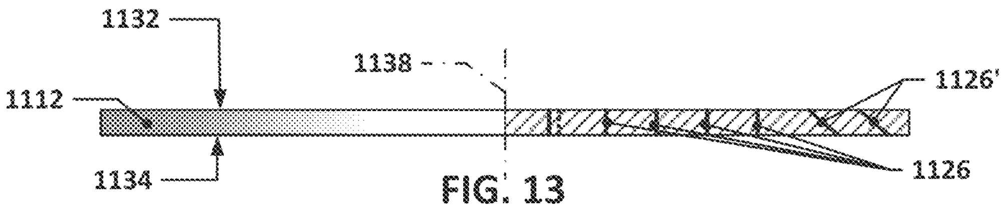

FIGS. 11, 12, and 13 depict an isometric view, top view, and side partial-section view of another example showerhead faceplate that has two circular patterns of obliquely angled gas distribution passages. The showerhead faceplate 1112 of FIGS. 11 through 13 is similar to that of the showerhead faceplate 512, and it may be assumed that features that are called out with the callouts having the same last two digits as corresponding callouts in FIGS. 5 through 7 are analogous to the features in FIGS. 5 through 7 that have callouts with the same last two digits. Accordingly, the prior description of such analogous elements with respect to FIGS. 5 through 7 is equally applicable here to such analogues unless otherwise indicated or apparent. In FIGS. 11 through 13, the outermost circular pattern of gas distribution passages 1126' is the second circular pattern, and the circular pattern of gas distribution passages 1126' immediately radially inward of the second circular pattern is the first circular pattern.

In some such implementations, there may be additional concentric circular patterns of gas distribution passages that are located within the first circular pattern, i.e., having diameters smaller than that of the first circular pattern. Such additional concentric circular patterns may, for example, be radially spaced apart similar to what was discussed above. One or more, and in at least one instance, all, of the gas distribution passages within these additional circular patterns within the first circular pattern may extend along axes that are parallel to the center axis of the showerhead faceplate. In some implementations, there may be a circular region 1111 where the gas distribution passages of the first circular pattern lie entirely inside of the circular region and the gas distribution passages of the second circular pattern lie entirely outside of the circular region 1111.

Figure 14:
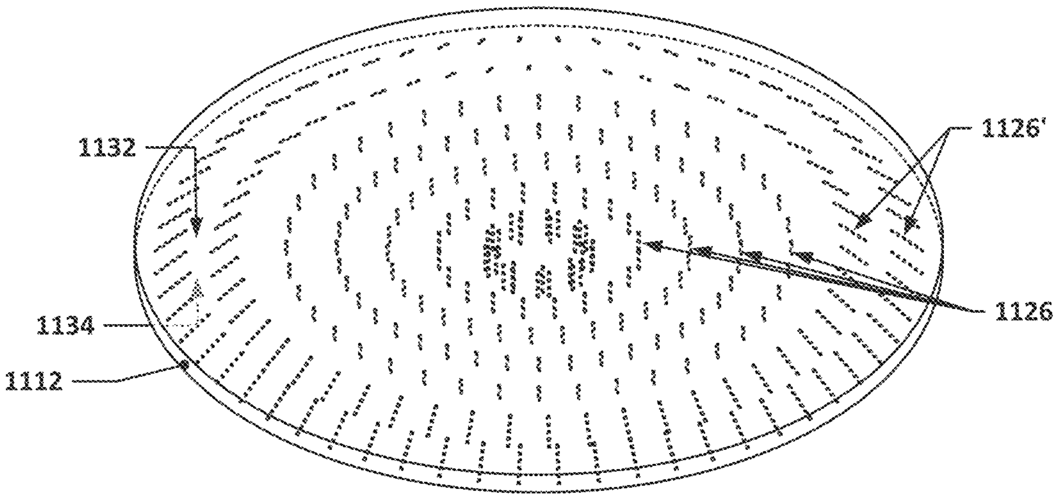
FIGS. 14, 15, and 16 depict an isometric view, top view, and side partial-section view of an example showerhead faceplate similar to that of FIGS. 11, 12, and 13 but having a contoured underside.
Figure 15:
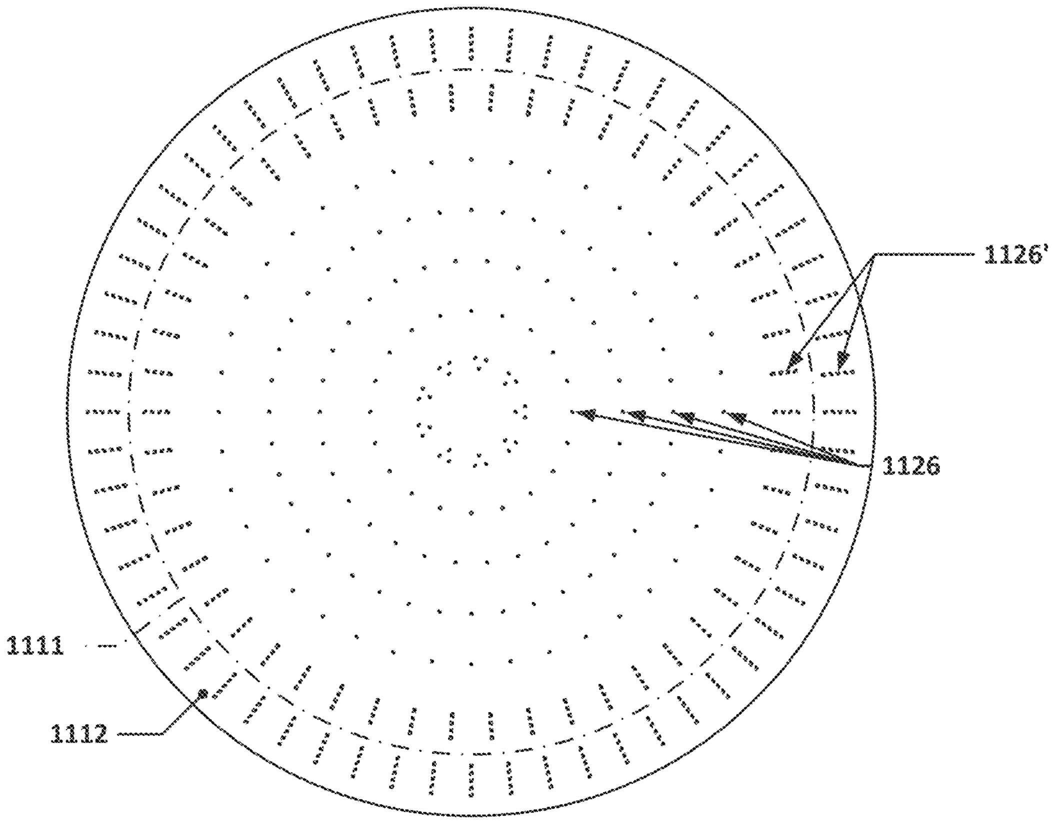
Figure 16:
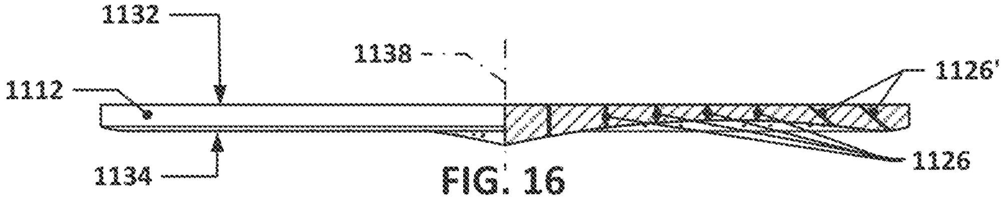

FIGS. 14, 15, and 16 depict an isometric view, top view, and side partial-section view of an example showerhead faceplate similar to that of FIGS. 11, 12, and 13 but having a contoured underside.

Figure 17:
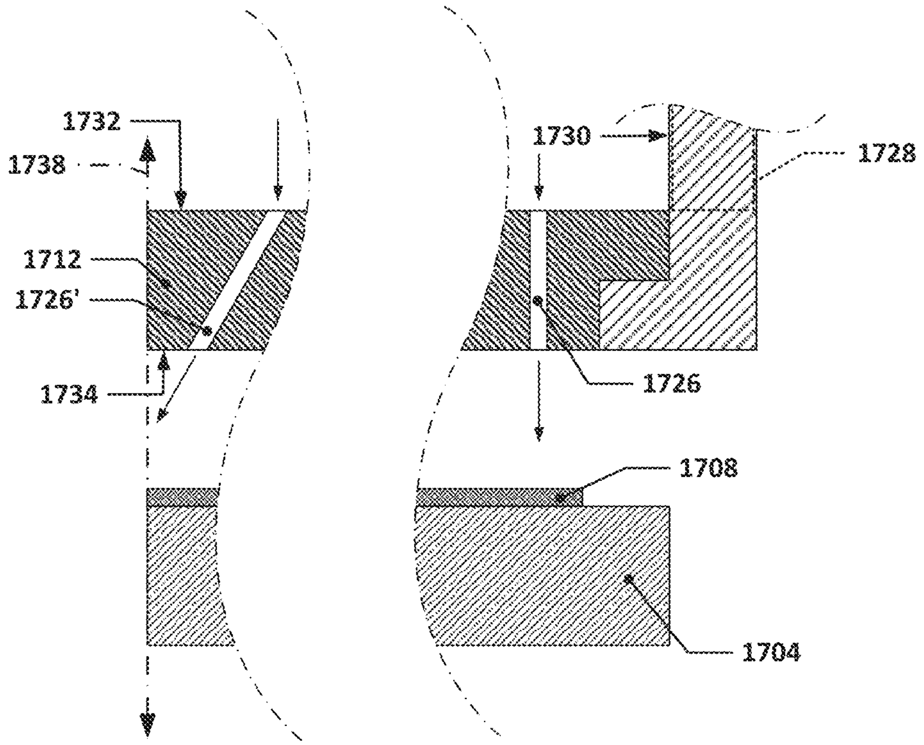
FIG. 17 depicts a cross-sectional view of portions of another example showerhead faceplate installed in an example semiconductor processing apparatus.

An alternate arrangement is shown in FIG. 17, which depicts a cross-sectional view of portions of another example showerhead faceplate installed in an example semiconductor processing apparatus. Many of the various elements shown in FIG. 17 (and in the remaining Figures) are similar to those shown in FIG. 4, and reference numbers with the same last two digits are used to indicate such similar elements in FIG. 17 (and the remaining Figures). The reader is referred to the discussion above with regard to FIG. 4 for discussion of such elements; in the interest of brevity, such elements are not described in depth below except where context requires it.

As can be seen in FIG. 17, the gas distribution passages 1726 furthest from the center axis 1738 of the showerhead faceplate 1712 are holes with center axes that are parallel to the center axis 1738. However, the gas distribution passages 1726' that are closest to the center axis 1738 are holes that extend along axes that are at an oblique angle to the center axis 1738. In this example, the gas distribution passages 1726' that are closest to the center axis 1738 are angled such that the locations where such gas distribution passages 1726' intersect the first side 1732 of the showerhead faceplate 1712 are further from the center axis 1738 than the locations where those gas distribution passages 1726' intersect the second side 1734 of the showerhead faceplate 1712.

Such an arrangement may cause gas that is directed through the angled gas distribution passages 1726' to have an increased flow velocity across the wafer in the radially inward direction relative to the center axis 1738 as compared with gas flows from non-angled gas distribution passages 1726. This may cause such gas to have more residence time over the wafer and to initially move towards the wafer center before moving towards the wafer perimeter.

In some implementations similar to that of FIG. 17, the showerhead faceplate may have, for example, a circular pattern of multiple sets of multiple gas distribution passages in which at least one of the gas distribution passages in each set of gas distribution passages extends along an axis that is at an oblique angle to the center axis.

Figure 18:
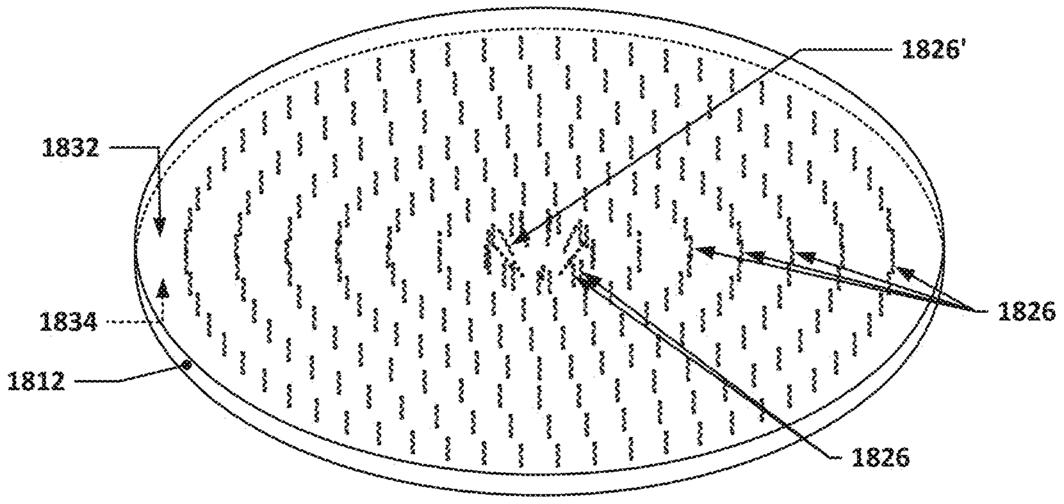
FIGS. 18, 19, and 20 depict an isometric view, top view, and side partial-section view of another example showerhead faceplate.
Figure 19:
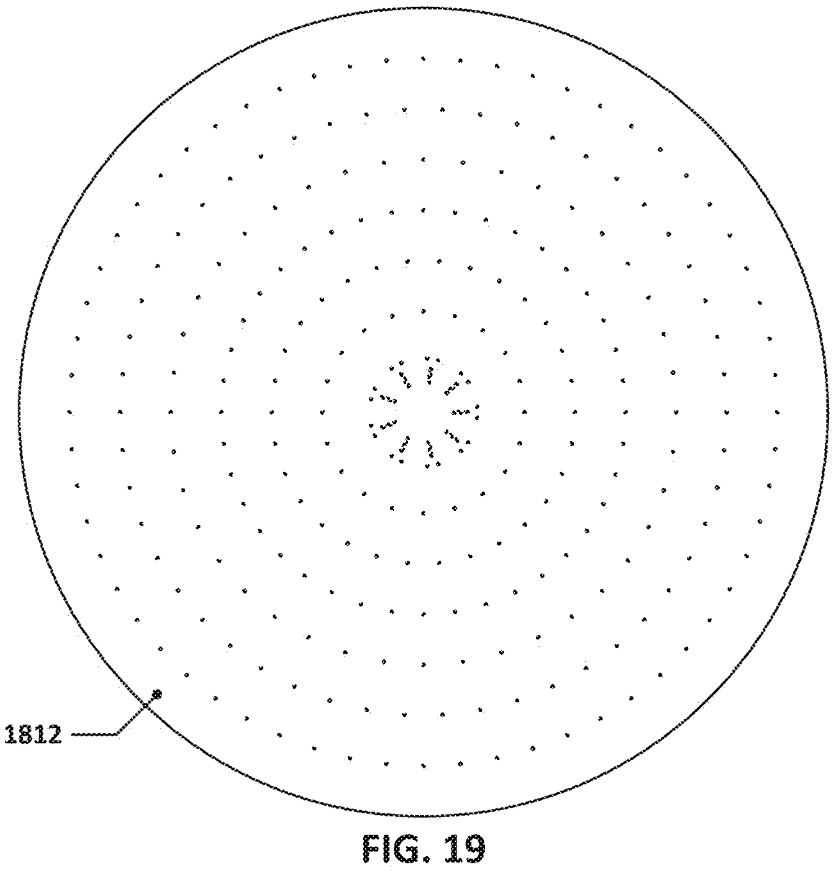
Figure 20:
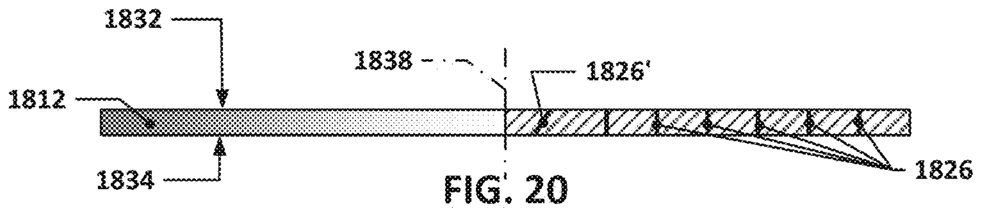

FIGS. 18, 19, and 20 depict an isometric view, top view, and side partial-section view of another example showerhead faceplate having such an arrangement of gas distribution passages. The showerhead faceplate 1812 of FIGS. 18 through 20 is similar to that of the showerhead faceplate 512, and it may be assumed that features that are called out with the callouts having the same last two digits as corresponding callouts in FIGS. 5 through 7 are analogous to the features in FIGS. 5 through 7 that have callouts with the same last two digits. Accordingly, the prior description of such analogous elements with respect to FIGS. 5 through 7 is equally applicable here to such analogues unless otherwise indicated or apparent.

Such a circular array may, for example, have a nominal diameter of between 1 in and 2 in, e.g., between about 1.3 and 1.4 inches. Each set of gas distribution passages may, for example, have a triplet of three gas distribution passages that are arranged with the locations where the three gas distribution passages intersect the first side of the showerhead faceplate forming an equilateral triangle pattern, e.g., a three-item circular array with a circular array diameter of, for example, between 0.1 in and 0.25 in, e.g., approximately 0.15 in or 0.2 in. In some instances, the number of gas distribution passages in each set of gas distribution passages may be more than three, e.g., four, five, six, etc. In some examples, the sets of gas distribution passages may each include at least two gas distribution passages that extend through the showerhead faceplate along directions that are substantially parallel to the center axis, with one or more of the remaining gas distribution passages in each such set extending at least partially along an axis or axes that is or are at an oblique angle or angles to the center axis or to an axis parallel to the center axis. In FIGS. 18 through 20, the gas distribution passages 1826' in each triplet of gas distribution passages shown in the innermost circular pattern of gas distribution passages are obliquely angled, while the other two gas distribution passages 1826 within each such triplet are not obliquely angled.

For example, in some such implementations, a gas distribution passage in each set of gas distribution passages that is at the oblique angle may be at an inward angle of between about 20° to 40°, e.g., 30°, relative to an axis parallel to the center axis of the showerhead faceplate, such that such gas distribution passages exit the second side of the showerhead faceplate (opposite the first side thereof) closer to the center axis of the showerhead faceplate than where those passages exit the first side of the showerhead faceplate. In some such implementations, there may also be multiple additional concentric circular patterns of gas distribution passages that are arranged around the center axis of the showerhead faceplate as well. For example, there may be 5, 6, 7, 8, 9, 10, etc. additional concentric circular patterns of gas distribution passages that extend through the showerhead faceplate. In some such implementations, there may be seven additional concentric patterns of gas distribution passages. In some further such implementations, each circular pattern of gas distribution passages may have between 6 and 14 or, in some cases, between 8 and 12 additional gas distribution passages in it as compared with the number of gas distribution passages (or sets of gas distribution passages with regard to the innermost circular pattern) in the next smallest diameter circular pattern of gas distribution passages. Such additional concentric circular patterns may have diameters that are larger than the diameter of the circular pattern of the multiple sets of gas distribution passages, e.g., each circular pattern (with respect to the locations where the gas distribution passages intersect the first side of the showerhead faceplate) may have a radius on the order of 0.5 in to 1 in larger than the radius of the next closest smaller circular pattern. The gas distribution passages in such implementations may, for example, be approximately 0.02 inches to 0.04 inches in diameter.

The showerhead faceplate shown in FIGS. 18 through 20, e.g., having angled gas distribution passages near the center of the showerhead faceplate, may provide for enhanced wafer uniformity near the center of the wafer. For example, in some instances, it may be desirable to avoid having gas distribution passages that exit the showerhead faceplate near the center of the showerhead faceplate, as holes or openings near the center of the showerhead faceplate may be subject to increased risk of hollow cathode discharge events due to increased radio-frequency energy near the center of the showerhead faceplate. However, omitting gas distribution passages from the center of the showerhead faceplate may produce a dead zone in the center of the wafer which suffers from lower gas delivery and thus becomes a source of wafer non-uniformity. The use of gas distribution passages such as the gas distribution passages 1826' that are sloped so as to direct gas both to locations that are radially inwards and closer to the wafer center (but not close enough that there is a risk of hollow cathode discharge) may assist with ensuring that processing gas is adequately delivered to the center of the wafer. For example, the combination of the closer proximity of the gas delivery points to the center of the wafer along with the radially inward velocity vectors of the gas flows from the gas distribution passages 1826' may act to increase the flow of gas to the very center of the wafer during processing, thereby reducing the wafer center non-uniformity.

Figure 21:
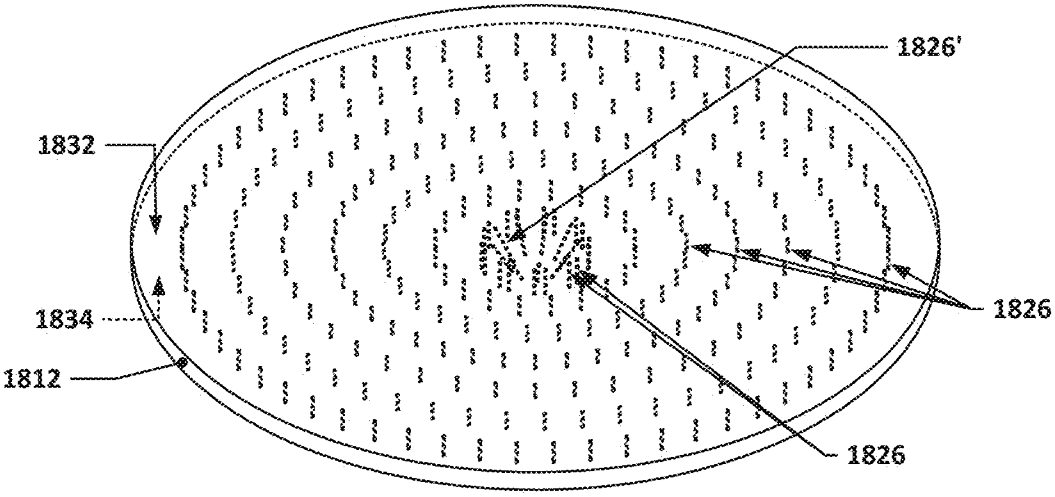
FIGS. 21, 22, and 23 depict an isometric view, top view, and side partial-section view of an example showerhead faceplate similar to that of FIGS. 18, 19, and 20 but having a contoured underside.
Figure 22:
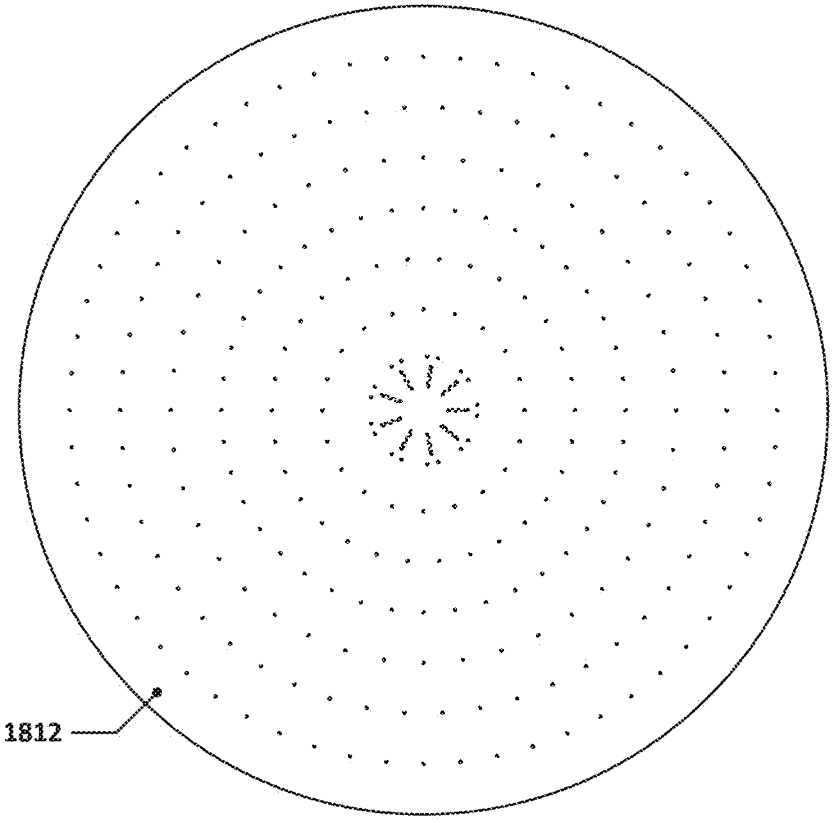
Figure 23:
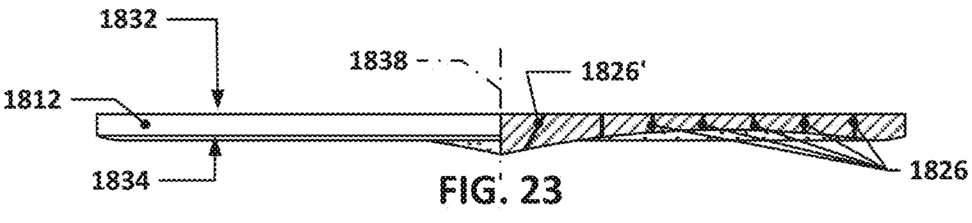

FIGS. 21, 22, and 23 depict an isometric view, top view, and side partial-section view of an example showerhead faceplate similar to that of FIGS. 18, 19, and 20 but having a contoured underside.

It will be recognized that the arrangements shown in FIGS. 4 and 17 may also include arrangements in which there are multiple concentric patterns of angled gas distribution passages, e.g., 2, 3, 4, etc. concentric rings of such angled gas distribution passages. In some extreme cases, all of the gas distribution passages may be angled in either of the orientations shown, e.g., angled radially inward (as shown in FIG. 17) or angled radially outward (as shown in FIG. 4). It will also be appreciated that additional arrangements of angled gas distribution passages may be used in some implementations in which gas distribution passages that are angled radially inward may be located furthest from the center axis of the showerhead faceplate or gas distribution passages that are angled radially outward are located closest to the center axis of the showerhead faceplate.

For clarity, reference to gas distribution passages, or portions thereof, that are angled in a radially inward direction are to be understood to refer to gas distribution passages, or portions thereof, where that gas distribution passage, or portion thereof, extends along an axis that gets closer to the center axis of the showerhead faceplate with increasing distance from the first side of the showerhead faceplate and decreasing distance from the second side of the showerhead faceplate. Conversely, reference to gas distribution passages, or portions thereof, that are angled in a radially outward direction are to be understood to refer to gas distribution passages, or portions thereof, where that gas distribution passage, or portion thereof, extends along an axis that gets further from the center axis of the showerhead faceplate with increasing distance from the first side of the showerhead faceplate and decreasing distance from the second side of the showerhead faceplate.

It will be further appreciated that in some implementations, there may be multiple annular regions of such a showerhead faceplate that may each feature angled gas distribution passages that are angled at different oblique angles relative to the center axis of the showerhead faceplate. For example, there may be a first annular region with gas distribution passages that extend along axes that are at an angle X relative to the center axis of the showerhead faceplate, and a second annular region that surrounds the first annular region and that has gas distribution passages that extend along axes that are at an angle Y relative to the center axis of the showerhead faceplate, where X and Y are different.

Figure 24:
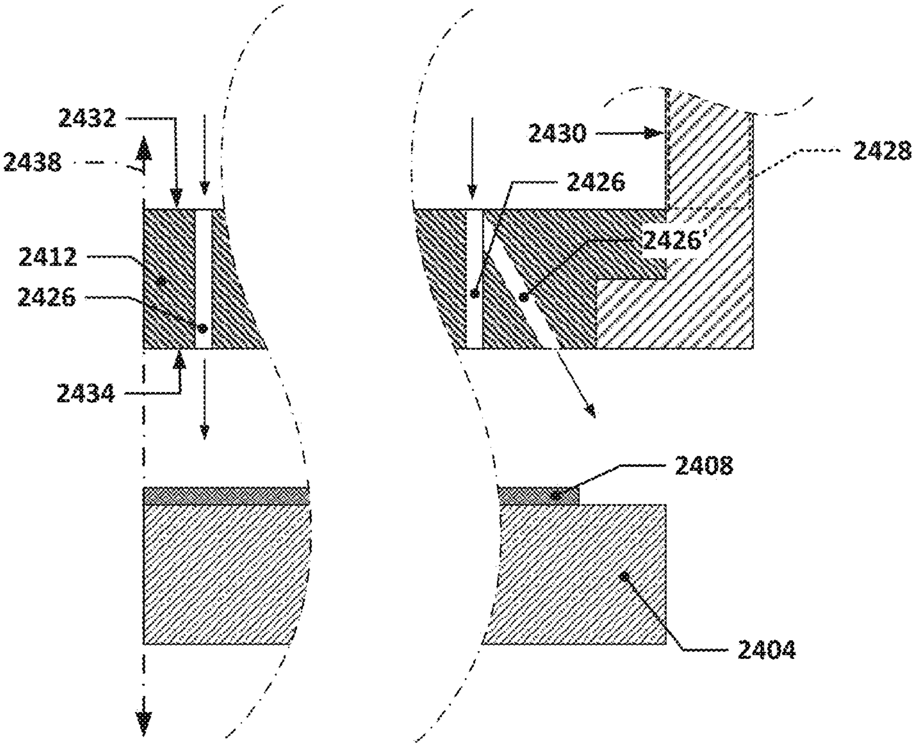
FIG. 24 depicts a cross-sectional view of portions of yet another example showerhead faceplate installed in an example semiconductor processing apparatus.

FIG. 24 depicts a cross-sectional view of portions of yet another example showerhead faceplate installed in an example semiconductor processing apparatus. The showerhead faceplate 2412 of FIG. 24 is similar to that shown in FIG. 4, with a subset of angled gas distribution passages 2426' (shown in dashed lines to indicate that they are "behind" the non-angled gas distribution passages 2426 in this view) located near the outer edge, adjacent to the boundary between the perimeter region and the interior region of the showerhead faceplate 2412 (as defined by the interior circumferential wall surface 2430). The showerhead faceplate 2412, however, also has another subset of non-angled gas distribution passages 2426 located in generally the same location, e.g., at locations along the same circular path but interposed between the locations where the gas distribution passages 2426' are located. Thus, the outermost ring of gas distribution passages may feature, for example, circumferentially alternating gas distribution passages 2426 and 2426'.

Figure 25:
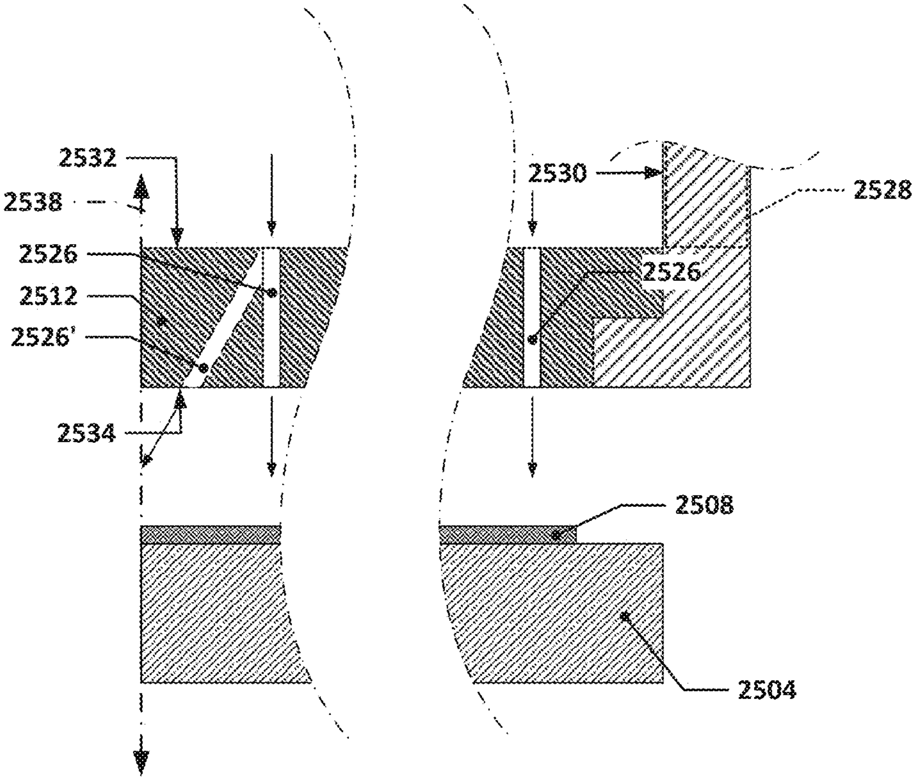
FIG. 25 depicts a cross-sectional view of portions of a further example showerhead faceplate installed in an example semiconductor processing apparatus.

FIG. 25 depicts a cross-sectional view of portions of a further example showerhead faceplate installed in an example semiconductor processing apparatus. The arrangement of FIG. 25 is similar to, and somewhat of a hybrid of, those of FIGS. 17 and 24, featuring gas distribution passages 2526' that are closest to the center axis 2538 that are angled radially inward and circumferentially interposed between gas distribution passages 2526 that are not angled relative to the center axis 2538.

It will be recognized that the arrangements shown in FIGS. 24 and 25 may also include arrangements in which there are multiple concentric patterns of circumferentially interposed angled gas distribution passages and non-angled gas distribution passages, e.g., 2, 3, 4, etc. concentric rings of such circumferentially interposed angled gas distribution passages and non-angled gas distribution passages. In some extreme cases, such circumferentially interposed angled gas distribution passages and non-angled gas distribution passages may extend across the entire showerhead faceplate (angled in either of the orientations shown, e.g., angled radially inward (as shown in FIG. 25) or angled radially outward (as shown in FIG. 25). It will also be appreciated that additional arrangements of circumferentially interposed angled gas distribution passages and non-angled gas distribution passages may be used in some implementations in which circumferentially interposed angled gas distribution passages and non-angled gas distribution passages with gas distribution passages that are angled radially inward may be located furthest from the center axis of the showerhead faceplate or circumferentially interposed angled gas distribution passages and non-angled gas distribution passages with gas distribution passages that are angled radially outward are located closest to the center axis of the showerhead faceplate.

It will be recognized that the arrangements shown in FIGS. 24 and 25 may also include arrangements in which there are multiple concentric patterns of circumferentially interposed angled gas distribution passages that extend along axes that are at different angles to the center axis of the showerhead faceplate (and may not necessarily include non-angled gas distribution passages) as opposed to along the same angles. For example, there may be two sets of angled gas distribution passages within a given annular region of a showerhead faceplate, with the angled gas distribution passages of one set generally circumferentially interposed between the angled gas distribution passages of the other set. The angled gas distribution passages in each set of angled gas distribution passages in that annular region may, however, extend along axes that are at different oblique angles relative to the center axis of the showerhead faceplate.

Figure 26:
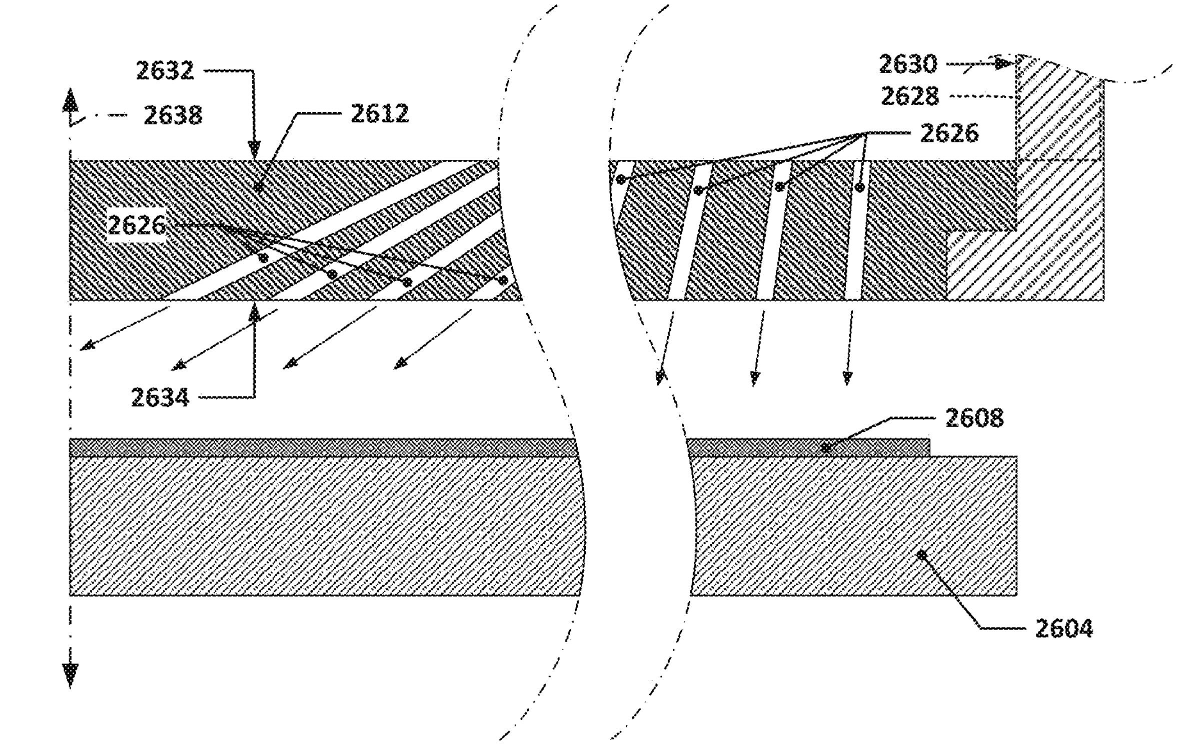
FIG. 26 depicts a cross-sectional view of portions of a further example showerhead faceplate installed in an example semiconductor processing apparatus.

FIG. 26 depicts a cross-sectional view of portions of a further example showerhead faceplate installed in an example semiconductor processing apparatus. In FIG. 26, a plurality of gas distribution passages 2626 are arranged in multiple concentric patterns, with the gas distribution passages 2626 of the concentric patterns being angled radially inward at smaller and smaller angles relative to the center axis 2638 with increasing diameter of each circular pattern of gas distribution passages 2626. In other words, the angles between the center axis 2638 and the axes along which the gas distribution passages 2626 in each circular pattern at least partially extend decrease as a function of increasing diameter of each circular pattern.

Such an arrangement may cause gas that is flowed through the showerhead to have a stronger flow bias towards the center of the wafer in the center of the showerhead faceplate and a less biased radially inward flow towards the perimeter of the showerhead.

Figure 27:
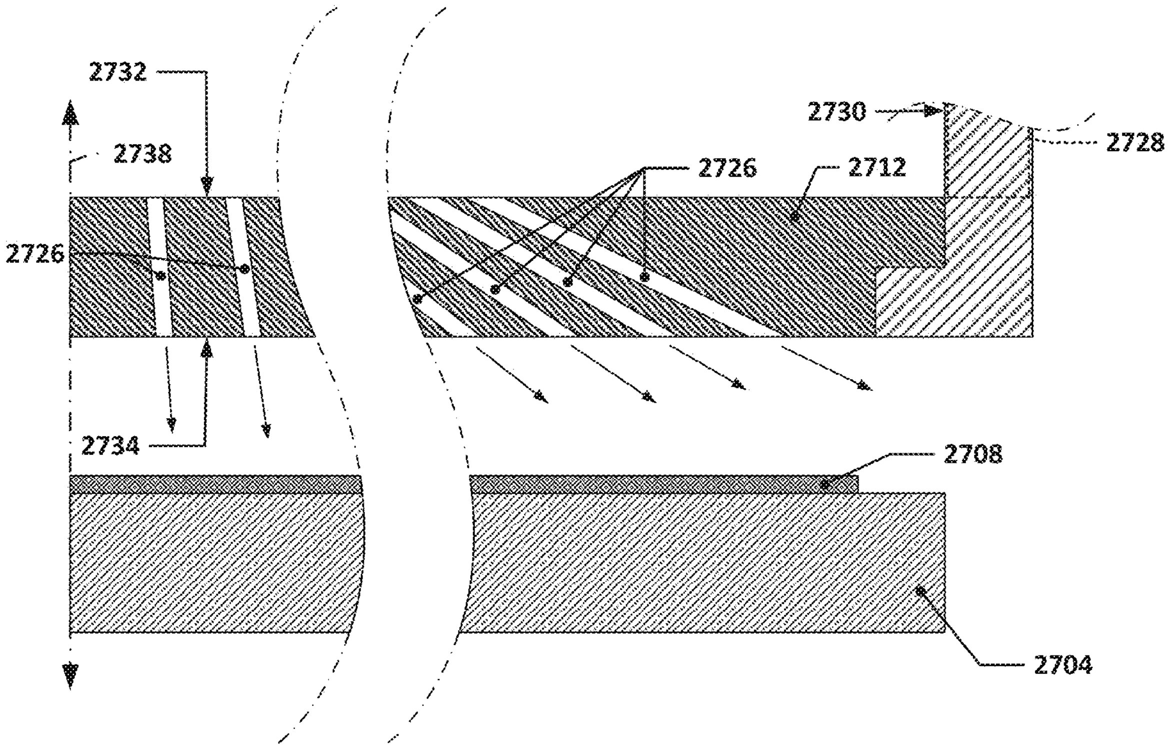
FIG. 27 depicts a cross-sectional view of portions of yet another example showerhead faceplate installed in an example semiconductor processing apparatus.

FIG. 27 depicts a cross-sectional view of portions of yet another example showerhead faceplate installed in an example semiconductor processing apparatus. In FIG. 27, a plurality of gas distribution passages 2726 are arranged in multiple concentric patterns, with the gas distribution passages 2726 of the concentric patterns being angled radially outward at larger and larger angles relative to the center axis 2738 with increasing diameter of each circular pattern of gas distribution passages 2726. In other words, the angles between the center axis 2738 and the axes along which the gas distribution passages 2726 in each circular pattern at least partially extend increase as a function of increasing diameter of each circular pattern.

Such an arrangement may cause gas that is flowed through the showerhead to have a stronger flow bias towards the perimeter of the wafer near the outer perimeter of the showerhead faceplate and a less radially outward flow towards the center of the showerhead.

It will be appreciated as well that arrangements such as those of FIGS. 26 and 27 may also be blended with other arrangements. For example, a showerhead faceplate may have a first annular region in which non-angled gas distribution passages are provided, and a second annular region surrounding the first annular region in which the gas distribution passages are arranged in multiple concentric circular patterns with the gas distribution passages of the concentric patterns being angled radially outward at larger and larger angles relative to the center axis with increasing diameter of each circular pattern of gas distribution passages.

Figure 28:
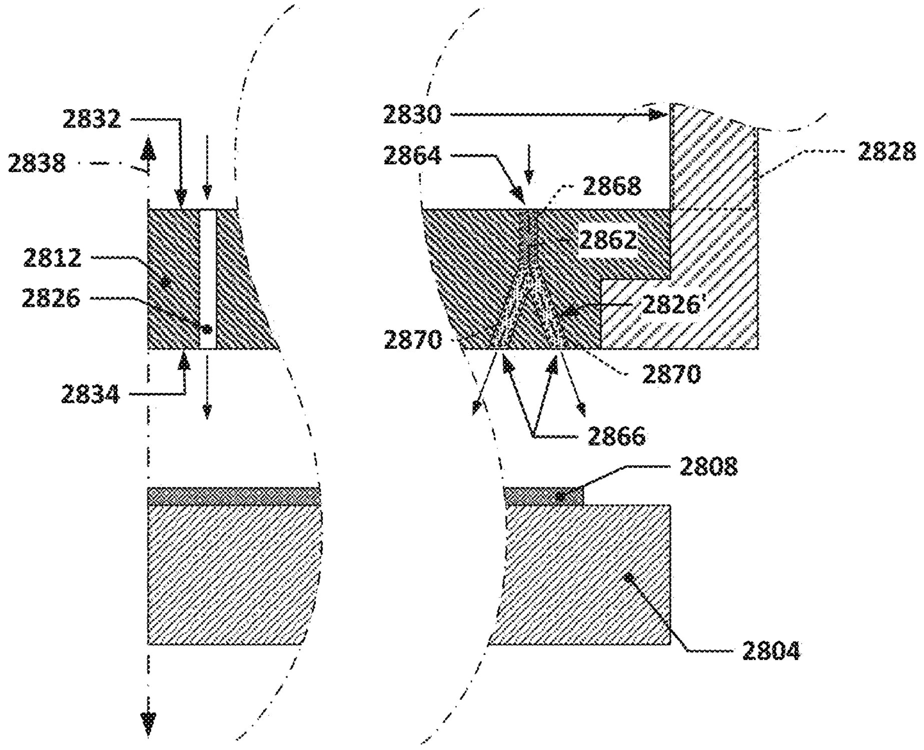
FIG. 28 depicts a cross-sectional view of portions of an additional example showerhead faceplate installed in an example semiconductor processing apparatus.

FIG. 28 depicts a cross-sectional view of portions of an additional example showerhead faceplate installed in an example semiconductor processing apparatus. In FIG. 28, the gas distribution passages 2826' follow branching paths 2862 through the showerhead faceplate. In this example, the gas distribution passages 2826' feature multiple portions, including inlet portions 2868 and outlet portions 2870. The inlet portions 2868 may each have a first end that terminates at an inlet opening 2864 located on the first side 2832. Correspondingly, the outlet portions 2870 may each have a first end that terminates at a corresponding outlet opening 2866 located on the second side 2834. The inlet portion 2868 and the outlet portions 2870 for a given gas distribution passage 2826' may also have second ends that fluidically connect with one another within the showerhead faceplate 2812, thereby allowing gases that are flowed into those gas distribution passages 2826' via the corresponding inlet openings 2864 to be subdivided into multiple gas flows that exit those gas distribution passages 2826' via the outlet openings 2866 thereof.

For the purposes of this disclosure, the term "fluidically connected" is used with respect to volumes, plenums, holes, etc., that may be connected with one another in order to form a fluidic connection, similar to how the term "electrically connected" is used with respect to components that are connected together to form an electric connection. The term "fluidically interposed," if used, may be used to refer to a component, volume, plenum, or hole that is fluidically connected with at least two other components, volumes, plenums, or holes such that fluid flowing from one of those other components, volumes, plenums, or holes to the other or another of those components, volumes, plenums, or holes would first flow through the "fluidically interposed" component before reaching that other or another of those components, volumes, plenums, or holes. For example, if a pump is fluidically interposed between a reservoir and an outlet, fluid that flowed from the reservoir to the outlet would first flow through the pump before reaching the outlet.

Figure 29:
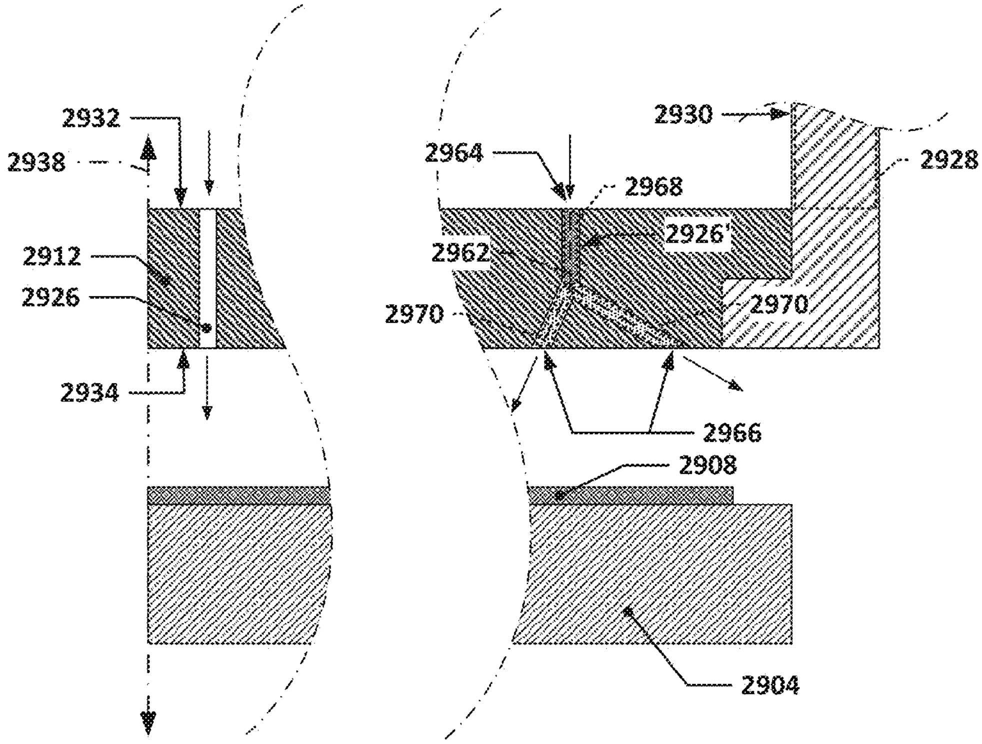
FIG. 29 depicts a cross-sectional view of portions of another example showerhead faceplate installed in an example semiconductor processing apparatus.

In the implementation of FIG. 28, the outlet portions 2870 are of equal length, which may provide for generally equal flow resistance in each outlet portion 2870 and thus generally evenly divided flow between each outlet portion 2870. It will be appreciated, however, that other implementations may feature branching gas distribution passages in which the outlet portions may not all be the same length. An example of this may be seen in FIG. 29, which depicts a cross-sectional view of portions of another example showerhead faceplate installed in an example semiconductor processing apparatus. In FIG. 29, gas distribution passages 2926' are shown which follow branching paths and which feature outlet portions 2970 of unequal lengths. Thus, the outlet portion 2970 that terminates at an outlet opening 2966 that is located further from the center axis 2938 is longer than the outlet portion 2970 that terminates at an outlet opening 2966 that is closer to the center axis 2838.

Such arrangements may allow for gas to be provided at a single flow rate to an inlet opening 2964 of a showerhead faceplate 2912 and then subdivided into gas flows having different flow rates through multiple outlet openings 2966 of the showerhead faceplate 2912.

It will also be appreciated that gas distribution passages that follow branching paths, while shown in FIGS. 28 and 29 as following two-dimensional branching paths, may also follow three-dimensional branching paths, e.g., where there are three or four outlet portions radiating out from a single inlet portion, and where the branches of the branching path do not necessarily all lie in the same plane. It will be further appreciated that the gas distribution passages that follow branching paths may also feature inlet portions and outlet portions having different cross-sectional dimensions. For example, an inlet portion for a branching gas distribution passage may have a larger cross-sectional area than the outlet portions fluidically connected thereto in order to permit sufficient gas flow to enter the inlet portion and provide adequate gas delivery through each of the outlet portions once subdivided. In some implementations, the one or more of the outlet portions for a given branching gas distribution passage may also have different cross-sectional areas than those of the other outlet portion(s) of that branching gas distribution passage. For clarity, when reference is made to the cross-sectional area of a gas distribution passage or portions thereof, it is to be understood that such a cross-sectional area refers to a cross-sectional area in corresponding cross-sectional plane that is perpendicular to the path or axis along which that gas distribution passage or portion thereof extends.

It will also be appreciated that while the gas distribution passages discussed herein may generally be linear in nature, e.g., holes that extend through showerhead faceplate along a linear axis, some gas distribution passages may follow paths that are non-linear in nature. For example, branching gas distribution passages would necessarily follow at least one non-linear path due to the presence of a branch in the path. It will also be understood, however, that even in non-branching gas distribution passages, there may be examples in which the gas distribution passage follows a non-linear path. For example, in some gas distribution passages, the gas distribution passage may include an inlet portion and an outlet portion that are fluidically connected within the showerhead faceplate; the inlet portion and the outlet portion, however, may extend along axes that are non-coincident and non-parallel with each other, e.g., one axis may be parallel to the center axis of the showerhead faceplate and the other axis may be at an oblique angle thereto. Alternatively, both portions may extend along axes that are at different oblique angles to the center axis of the showerhead faceplate.

It will also be further appreciated that while the gas distribution passages discussed herein may typically be provided as circular-cross-section holes, other cross-sectional shapes may be used as well. For example, if electrical discharge machining (EDM) processes such as sinker EDM or fast hole drilling EDM processes are used instead of conventional mechanical hole-drilling processes, the holes produced need not be constrained to circular cross-sections.

The showerhead faceplates discussed above include various implementations shown as flat showerhead faceplates, e.g., with the bottom and top surfaces thereof being planar. However, it is to be understood that one or both of the top and/or bottom surfaces of such showerhead faceplates may have a contoured surface, i.e., having a non-planar aspect (for example, such as the showerhead faceplates of FIGS. 8 through 10, 14 through 16, or 21 through 23). For example, in some implementations, the bottom surface of such showerhead faceplates (the surface that faces towards a wafer during processing operations) may be contoured so as to be closest to the wafer (during use) at the center and then slope gradually away from the wafer with increasing radial distance from the center axis of the showerhead faceplate.

The use, if any, of ordinal indicators, e.g., (a), (b), (c) . . . or the like, in this disclosure and claims is to be understood as not conveying any particular order or sequence, except to the extent that such an order or sequence is explicitly indicated. For example, if there are three steps labeled (i), (ii), and (iii), it is to be understood that these steps may be performed in any order (or even concurrently, if not otherwise contraindicated) unless indicated otherwise. For example, if step (ii) involves the handling of an element that is created in step (i), then step (ii) may be viewed as happening at some point after step (i). Similarly, if step (i) involves the handling of an element that is created in step (ii), the reverse is to be understood. It is also to be understood that use of the ordinal indicator "first" herein, e.g., "a first item," should not be read as suggesting, implicitly or inherently, that there is necessarily a "second" instance, e.g., "a second item."

It is to be understood that the phrases "for each <item> of the one or more <items>," "each <item> of the one or more <items>," or the like, if used herein, are inclusive of both a single-item group and multiple-item groups, i.e., the phrase "for . . . each" is used in the sense that it is used in programming languages to refer to each item of whatever population of items is referenced. For example, if the population of items referenced is a single item, then "each" would refer to only that single item (despite the fact that dictionary definitions of "each" frequently define the term to refer to "every one of two or more things") and would not imply that there must be at least two of those items. Similarly, the term "set" or "subset" should not be viewed, in itself, as necessarily encompassing a plurality of items—it will be understood that a set or a subset can encompass only one member or multiple members (unless the context indicates otherwise).

It should be appreciated that all combinations of the foregoing concepts (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

It is to be further understood that the above disclosure, while focusing on a particular example implementation or implementations, is not limited to only the discussed example, but may also apply to similar variants and mechanisms as well, and such similar variants and mechanisms are also considered to be within the scope of this disclosure.

What is claimed is:

1. An apparatus comprising:

a showerhead faceplate having N sets of gas distribution passages, each gas distribution passage extending from a first side of the showerhead faceplate to a second side of the showerhead faceplate opposite the first side of the showerhead faceplate, wherein:

the second side of the showerhead faceplate is configured to face towards, and be exposed to, a wafer support located within a semiconductor processing chamber when the showerhead faceplate is installed in the semiconductor processing chamber as part of a showerhead of that semiconductor processing chamber, the N sets of gas distribution passages comprise a first set of gas distribution passages comprising a first subset of gas distribution passages and a second subset of gas distribution passages, the gas distribution passages in the first subset of gas distribution passages extend at least partially along axes that are each at a first angle relative to the first side, the gas distribution passages in the second subset of gas distribution passages extend at least partially along axes that are each at a second angle relative to the first side, the first angle is greater than the second angle, the gas distribution passages in the first set of gas distribution passages are arranged such that locations where the gas distribution passages in the first set of gas distribution passages intersect the first side of the showerhead faceplate are grouped in a first set of clusters arranged along a first circular path, and each cluster in the first set of clusters is a circular array of locations centered on the first circular path.

2. The apparatus of claim 1, wherein the first angles and the second angles are both oblique angles.

3. The apparatus of claim 1, wherein:

the gas distribution passages in the first subset of gas distribution passages intersect the second side of the showerhead faceplate at locations located a first distance from the center axis of the showerhead faceplate, the gas distribution passages in the second subset of gas distribution passages intersect the second side of the showerhead faceplate at locations located a second distance from the center axis of the showerhead faceplate, and the first distance is smaller than the second distance.

4. The apparatus of claim 3, wherein:

the locations where the gas distribution passages in the first set of gas distribution passages intersect the first side of the showerhead faceplate form a first circular pattern extending around the center axis, the locations where the gas distribution passages in the first subset of gas distribution passages intersect the second side of the showerhead faceplate form a second circular pattern extending around the center axis and having a diameter substantially equal to a diameter of the first circular pattern, and the locations where the gas distribution passages in the second subset of gas distribution passages intersect the second side of the showerhead faceplate form a third circular pattern extending around the center axis and having a diameter larger than the diameter of the first circular pattern and the diameter of the second circular pattern.

5. The apparatus of claim 4, wherein there are no gas distribution passages in the showerhead faceplate that intersect the first side of the showerhead faceplate at locations offset from the center axis by a distance that is half the diameter of the first circular pattern.

6. The apparatus of claim 1, wherein the gas distribution passages in the first set of gas distribution passages each intersect the first side of the showerhead faceplate at locations nominally equidistant from a center axis of the showerhead faceplate.

7. The apparatus of claim 1, wherein the clusters in the first set of clusters are arranged in a circular array centered on a center axis of the first circular path.

8. The apparatus of claim 7, wherein:

N is greater than two, the gas distribution passages in each of the second through Nth sets of gas distribution passages are respectively arranged such that locations where the gas distribution passages in the second through Nth sets of gas distribution passages intersect the first side of the showerhead faceplate are grouped in second through Nth sets of clusters, and the clusters in each set of clusters in the second through Nth sets of clusters are respectively arranged along second through Nth circular paths.

9. The apparatus of claim 8, wherein each cluster in the second through Nth sets of clusters is a circular array of locations centered, respectively, on the second through Nth circular paths.

10. The apparatus of claim 9, wherein:

the clusters in each of the second through Nth sets of clusters are arranged in respective circular arrays centered on the center axis, and each of the first through Nth circular paths has a different diameter.

11. The apparatus of claim 10, wherein the gas distribution passages in each cluster of gas distribution passages each extend at least partially along a corresponding axis that is at an oblique angle to the first side.

12. The apparatus of claim 7, wherein N=7.

13. The apparatus of claim 1, further comprising a gas distribution plate, wherein:

the gas distribution plate comprises a plurality of gas distribution ports exiting a first side of the gas distribution plate, the first side of the gas distribution plate contacts the first side of the showerhead faceplate, each gas distribution port is connected with a corresponding gas distribution plate passage located within the gas distribution plate, and the location where each gas distribution passage intersects the first side of the showerhead faceplate corresponds with a location of one of the gas distribution ports of the gas distribution plate.

14. The apparatus of claim 13, further comprising the wafer support, wherein the showerhead faceplate is positioned with the second side of the showerhead faceplate facing towards the wafer support.

15. The apparatus of claim 14, further comprising the semiconductor processing chamber, wherein at least the second side of the showerhead faceplate is located within the semiconductor processing chamber.

16. The apparatus of claim 1, wherein the second side of the showerhead faceplate is planar.

17. The apparatus of claim 1, wherein the second side of the showerhead faceplate is contoured.

18. The apparatus of claim 17, wherein the second side has an axisymmetric profile about a center axis of the first circular path.

19. The apparatus of claim 18, wherein:

the axisymmetric profile has a concave portion between the center axis and an outermost edge of the showerhead faceplate, and a portion of the second side of the showerhead faceplate that is coincident with the center axis is further from the first side of the showerhead faceplate than a remainder of the second side of the showerhead faceplate.

* * * * *